(12) United States Patent
Kim et al.

(10) Patent No.: US 9,972,568 B2
(45) Date of Patent: May 15, 2018

(54) STRETCHABLE SEMICONDUCTOR PACKAGES AND SEMICONDUCTOR DEVICES INCLUDING THE SAME

(71) Applicant: SK hynix Inc., Icheon-si, Gyeonggi-do (KR)

(72) Inventors: Jong Hoon Kim, Suwon-si (KR); Han Jun Bae, Seongnam-si (KR); Chan Woo Jeong, Chungju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/718,319

(22) Filed: Sep. 28, 2017

(65) Prior Publication Data

US 2018/0019188 A1    Jan. 18, 2018

Related U.S. Application Data

(62) Division of application No. 15/068,877, filed on Mar. 14, 2016, now Pat. No. 9,806,016.

(30) Foreign Application Priority Data

Nov. 24, 2015 (KR) ........................ 10-2015-0164881

(51) Int. Cl.
*H01L 29/06* (2006.01)
*H01L 23/498* (2006.01)
*H01L 23/00* (2006.01)
*H01L 23/31* (2006.01)
*H01L 23/29* (2006.01)

(52) U.S. Cl.
CPC ........ *H01L 23/4985* (2013.01); *H01L 23/293* (2013.01); *H01L 23/298* (2013.01); *H01L 23/3128* (2013.01); *H01L 24/32* (2013.01); *H01L 23/49811* (2013.01); *H01L 23/562* (2013.01); *H01L 2224/32013* (2013.01); *H01L 2224/32057* (2013.01); *H01L 2224/32238* (2013.01)

(58) Field of Classification Search
CPC ............. H01L 51/0072; H01L 51/5016; H01L 51/5056; H01L 51/5072; H01L 51/0052
USPC ....................................................... 257/618
See application file for complete search history.

(56) References Cited

U.S. PATENT DOCUMENTS 6,166,433 A * 12/2000 Takashima ............ H01L 21/563
                                                      257/693
6,396,159 B1 * 5/2002 Shoji ....................... H01L 23/16
                                                      257/668

(Continued)

FOREIGN PATENT DOCUMENTS

KR        20030017677 A      3/2003

*Primary Examiner* — Andy Huynh
(74) *Attorney, Agent, or Firm* — William Park & Associates Ltd.

(57) ABSTRACT

A semiconductor package includes a molding member, a chip embedded in the molding member to have a warped shape, and connectors disposed in the molding member. The molding member includes an extendible material which includes a first part having a warped shape, a second part extending from one end of the first part to be flat, and a third part extending from the other end of the first part to be flat, where first surfaces of the connectors are exposed at a surface of the molding member and second surfaces of the connectors are coupled to the chip.

19 Claims, 25 Drawing Sheets

(56) References Cited

U.S. PATENT DOCUMENTS

| | | |
|---|---|---|
| 9,437,580 B1* | 9/2016 | No ................... H01L 25/0657 |
| 2004/0214422 A1* | 10/2004 | Sato ................. H01L 23/49816 |
| | | 438/622 |
| 2007/0090469 A1 | 4/2007 | Kurita |
| 2008/0224329 A1* | 9/2008 | Schwab ................. H01L 21/56 |
| | | 257/783 |
| 2011/0193228 A1* | 8/2011 | Yu ........................ H01L 21/563 |
| | | 257/738 |
| 2011/0233771 A1* | 9/2011 | Kwon ..................... H01L 22/20 |
| | | 257/737 |
| 2015/0001685 A1 | 1/2015 | Chung et al. |
| 2015/0130071 A1 | 5/2015 | Hohlfeld et al. |
| 2015/0162265 A1 | 6/2015 | Jo et al. |
| 2015/0171028 A1 | 6/2015 | Jo et al. |
| 2016/0056091 A1 | 2/2016 | Kim et al. |

* cited by examiner

STRETCHABLE SEMICONDUCTOR PACKAGES AND SEMICONDUCTOR DEVICES INCLUDING THE SAME

CROSS-REFERENCE TO RELATED APPLICATION

The present application is a divisional application of U.S. application Ser. No. 15/068,877 filed on Mar. 14, 2016, and claims priority under 35 U.S.C § 119(a) to Korean Patent Application No. 10-2015-0164881, filed on Nov. 24, 2015, which is herein incorporated by reference in its entirety.

BACKGROUND

1. Technical Field

Various embodiments of the present disclosure relate to packages and, more particularly, to stretchable semiconductor packages and semiconductor devices including the same.

2. Related Art

With the development of smaller electronic systems such as mobile systems, semiconductor packages which are capable of processing a large amount of data are increasingly in demand. As electronic systems become lighter and smaller, the semiconductor packages employed in the electronic systems have been continuously scaled down. In addition, flexible electronic systems which are capable of bending or warping are increasingly in demand with an increase interest in portable and wearable electronic systems. Accordingly, flexible semiconductor packages have been developed to realize the portable and wearable electronic systems.

In general, flexible semiconductor packages mean semiconductor packages having a characteristic in which bodies of the semiconductor packages warp or bend when an external force is applied to the semiconductor packages. Recently, however, with the development of internet of things (IoT) and wearable devices, in addition to the flexible semiconductor packages stretchable semiconductor packages have been desired. Semiconductor chips employed in semiconductor packages have been fabricated having reduced thickness. Thus, these thinner semiconductor chips may easily warp or bend. However, most of the semiconductor chips may still lack a stretchable characteristic, where stretchable refers to the extendibility of length or width of the semiconductor chip. Accordingly, with today's technology it may be difficult to realize stretchable semiconductor packages including semiconductor chips.

SUMMARY

Various embodiments are directed to stretchable semiconductor packages and semiconductor devices including the same.

According to an embodiment, a semiconductor package includes an extendible molding member, a chip embedded in the molding member to have a warped shape, and connectors disposed in the molding member. First surfaces of the connectors are exposed at a surface of the molding member, and second surfaces of the connectors are coupled to the chip.

According to another embodiment, a semiconductor package includes a molding member comprised of an extendible material, a chip embedded in the molding member to have a warped shape, and connectors disposed in the molding member. The molding member includes a first part having a warped shape, a second part extending from one end of the first part to be flat, and a third part extending from the other end of the first part to be flat. First surfaces of the connectors are exposed at a surface of the molding member, and second surfaces of the connectors are coupled to the chip.

According to another embodiment, a semiconductor device includes a substrate, a semiconductor package, and joint electrodes. The substrate is comprised of a flexible and extendible material. The substrate includes conductive patterns disposed therein, and the conductive patterns are exposed at a surface of the substrate. The semiconductor package includes an extendible molding member, a chip embedded in the molding member to have a warped shape, and connectors disposed in the molding member. First surfaces of the connectors are exposed at a surface of the molding member, and second surfaces of the connectors are coupled to the chip. The joint electrodes connect the conductive patterns to the connectors.

According to another embodiment, a semiconductor device includes a substrate, a semiconductor package, and joint electrodes. The substrate is comprised of a flexible and extendible material. The substrate includes conductive patterns disposed therein, and the conductive patterns are exposed at a surface of the substrate. The semiconductor package includes an extendible molding member, a chip embedded in the molding member to have a warped shape, and connectors disposed in the molding member. First surfaces of the connectors are exposed at a surface of the molding member, and second surfaces of the connectors are coupled to the chip. The joint electrodes connect the conductive patterns to the connectors. The molding member includes a first part having a warped shape, a second part extending from one end of the first part to be flat, and a third part extending from the other end of the first part to be flat.

BRIEF DESCRIPTION OF THE DRAWINGS

Various embodiments of a present disclosure will become more apparent in view of the attached drawings and accompanying detailed description, in which.

DETAILED DESCRIPTION OF THE EMBODIMENTS

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "on," "over," "above," "under," "beneath," "below," "beside," or "aside" another element, the element may directly contact the other element, or at least one intervening element may be present therebetween. Accordingly, terms such as "on," "over," "above," "under," "beneath," "below," "beside," "aside," and the like that are used herein are for the purpose of describing only a positional relationship of two elements and are not intended to limit the scope of the present disclosure.

It will be further understood that when an element is referred to as being "connected" or "coupled" to another element, the element can be directly connected or coupled to the other element or intervening elements may be present. In contrast, when an element is referred to as being "directly connected" or "directly coupled" to another element, there are no intervening elements present between the coupled elements.

Figure 1:
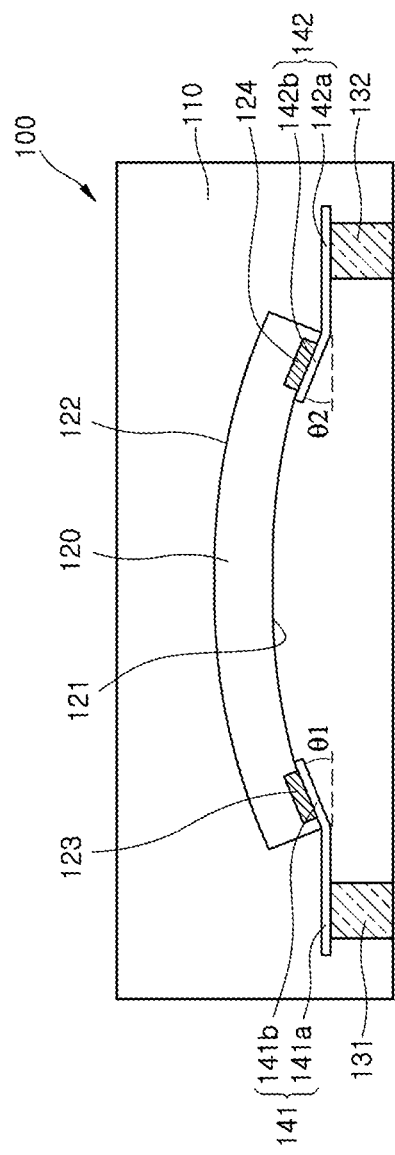
FIG. 1 is a cross-sectional view illustrating a stretchable semiconductor package according to an embodiment.

FIG. 1 is a cross-sectional view illustrating a stretchable semiconductor package 100 according to an embodiment. Referring to FIG. 1, the semiconductor package 100 may be configured to include a chip 120 embedded in a molding member 110. The molding member 110 may be comprised of an extendible material, and thus the molding member may be extendible. The extendible material used as the molding member 110 may include a polymer-based material. The polymer-based material may include a polydimethylsiloxane (PDMS) material, a poly-ethylene-terephthalate (PET) material, a polyimide (PI) material, or a silicone material. The material used as the molding member 110 may also be flexible in addition to extendible. The chip 120 may be a semiconductor chip including active elements (e.g., transistors) and/or passive elements (e.g., resistors, capacitors or inductors) which are realized in and/or on a semiconductor substrate. The chip 120 may be embedded in the molding member 110 in a warped shape. The chip 120 may be thinly fabricated to have a naturally warped shape. In an embodiment, the chip 120 may have a thickness of about 50 micrometers or less. The chip 120 may have a first surface 121 and a second surface 122 which are opposite to each other. First contact pads 123 and second contact pads 124 may be disposed on or in the first surface 121 of the chip 120. The first contact pads 123 and the second contact pads 124 may be disposed on both left and right ends of the first surface 121 of the chip 120, respectively. In an embodiment, the first contact pads 123 may be disposed on a left end of the chip 120, and the second contact pads 124 may be disposed on a right end of the chip 120. The chip 120 may be a flip chip. That is, the chip 120 may be disposed in the molding member 110 so that the first surface 121 of the chip 120 faces downward. The chip 120 may be disposed in the molding member 110 to have a crying shape. That is, both ends of the chip 120 may bend in a downward direction so that the second surface 122 of the chip 120 has a convex shape.

First connectors 131 and second connectors 132 may be disposed in the molding member 110. In an embodiment, first surfaces (i.e., bottom surfaces in the drawing) of the first and second connectors 131 and 132 may be exposed at a bottom surface of the molding member 110. Second surfaces of the first and second connectors 131 and 132 may be coupled to the chip 120 via first and second interconnectors 141 and 142. Sidewalls and top surfaces of the first and second connectors 131 and 132 may be surrounded by the molding member 110. The first connectors 131 may be disposed at a first end (i.e., a lower-left end) of the molding member 110 adjacent to the first contact pads 123. The second connectors 132 may be disposed at a second end (i.e., a lower-right end) of the molding member 110 adjacent to the second contact pads 124. In an embodiment, the first and second connectors 131 and 132 may be bumps.

Each of the first contact pads 123 may be electrically connected to one of the first connectors 131 through one of first interconnectors 141. Each of the second contact pads 124 may be electrically connected to one of the second connectors 132 through one of second interconnectors 142. The first and second interconnectors 141 and 142 may electrically connect the chip 120 to the first and second connectors 131 and 132. Each of the first and second interconnectors 141 and 142 may be a plate-shaped electrode. Specifically, each of the first interconnectors 141 may include a first horizontal portion 141a that contacts a top surface of one of the first connectors 131 and a first inclined portion 141b that extends from an end of the first horizontal portion 141a to contact a surface of one of the first contact pads 123. A first tilt angle θ1 of the first inclined portion 141b may be substantially equal to the arctangent value of a maximum slope of a left end of the chip 120, on which the first contact pads 123 are disposed. Similarly, each of the second interconnectors 142 may include a second horizontal portion 142a that contacts a top surface of one of the second connectors 132 and a second inclined portion 142b that extends from an end of the second horizontal portion 142a to contact a surface of one of the second contact pads 124. A second tilt angle θ2 of the second inclined portion 142b may be substantially equal to the arctangent value of a maximum slope of a right end of the chip 120, on which the second contact pads 124 are disposed. In an embodiment, the first and second interconnectors 141 and 142 may be comprised of a metal material. Although not shown in FIG. 1, a first conductive adhesion material may be disposed between the first interconnector 141 and the first connector 131 as well as between the first interconnector 141 and the first contact pad 123, and a second conductive adhesion material may be disposed between the second interconnector 142 and the second connector 132 as well as between the second interconnector 142 and the second contact pad 124.

Figure 2:
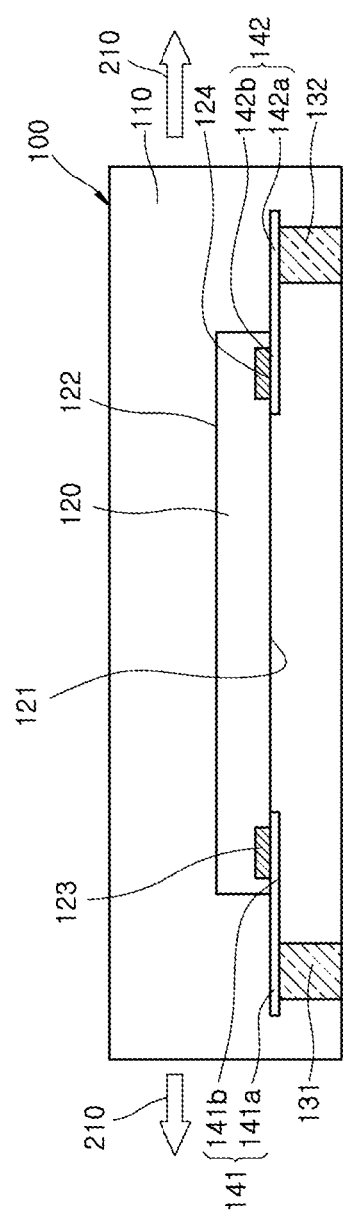
FIG. 2 is a cross-sectional view illustrating a stretched shape of the semiconductor package shown in FIG. 1.

FIG. 2 is a cross-sectional view illustrating a stretched shape of the semiconductor package 100 shown in FIG. 1. In FIG. 2, the same reference numerals used in FIG. 1 denote the same elements. Referring to FIG. 2, if a tensile force is applied to both ends of the semiconductor package 100 in opposite horizontal directions 210, the molding member 110 may extend in a horizontal direction. As a result, a vertical thickness of the molding member 110 may be reduced compared to an initial vertical thickness of the molding member 110, and a horizontal length of the molding member 110 may increase compared to an initial horizontal length of the molding member 110. Accordingly, the chip 120 having a warped shape may be straightened. Thus, the first connectors 131 and the first interconnectors 141 may move in a leftward direction, and the second connectors 132 and the second interconnectors 142 may move in a rightward direction. In such a case, a tensile stress in the leftward direction and the rightward direction as well as a pressure in a downward direction may be applied to the chip 120 so that the chip 120 having a warped shape is straightened to a flat form. If the chip 120 is straightened, the first inclined portion 141b and the second inclined portion 142b may also straighten to be flat. If the semiconductor package 100 is fully stretched in a horizontal direction, the first inclined portion 141b and the second inclined portion 142b may be coplanar with the first and second horizontal portions 141a and 142a and may be located at a same level as the first and second horizontal portions 141a and 142a.

Figure 3:
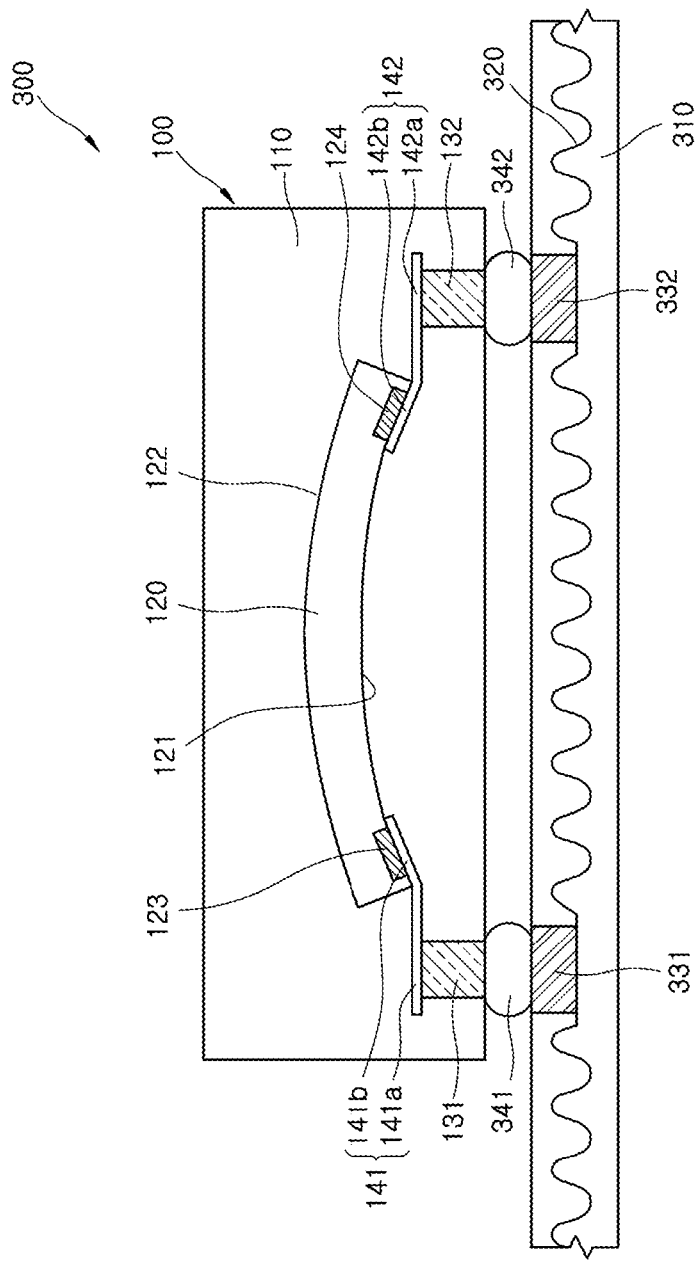
FIG. 3 is a cross-sectional view illustrating a semiconductor device including the semiconductor package shown in FIG. 1.

FIG. 3 is a cross-sectional view illustrating a semiconductor device 300 including the semiconductor package 100 shown in FIG. 1. In FIG. 3, the same reference numerals used in FIG. 1 denote the same elements. Thus, to avoid duplicate explanation, description of the same elements as set forth with reference to FIG. 1 will be omitted or briefly mentioned hereinafter. Referring to FIG. 3, the semiconductor device 300 may include the semiconductor package 100 as described with reference to FIG. 1 and a substrate 310 on which the semiconductor package 100 is mounted. In the present embodiment, the substrate 310 may be a printed circuit board (PCB). For example, the substrate 310 may be a motherboard constituting an electronic system. The substrate 310 may be comprised of a material that is flexible and an extendible. The flexible and extendible material used as the substrate 310 may include a polymer-based material. In an embodiment, the polymer-based material may include a polydimethylsiloxane (PDMS) material, a poly-ethyleneterephthalate (PET) material, a polyimide (PI) material, or a silicone material. Interconnection lines 320 may be disposed in the substrate 310. Each of the interconnection lines 320 may be comprised of a conductive material such as a metal material and may have an extendible or stretchable curved line shape. In an embodiment, each of the interconnection lines 320 may have a sine wave form, a curved line shape, or substantially wavy form and may be disposed along a horizontal direction, for example, a length direction of the substrate 310.

First conductive patterns 331 and second conductive patterns 332 may be disposed in the substrate 310. Sidewalls and bottom surfaces of the first and second conductive patterns 331 and 332 may be surrounded by the substrate 310, and top surfaces of the first and second conductive patterns 331 and 332 may be exposed at a top surface of the substrate 310. The exposed top surfaces of the first conductive patterns 331 may be coupled to the first connectors 131 through first joint electrodes 341, respectively. Similarly, the exposed top surfaces of the second conductive patterns 332 may be coupled to the second connectors 132 through second joint electrodes 342, respectively. Each of the first and second joint electrodes 341 and 342 may be comprised of a conductive material, for example, a metal bump, or a solder ball.

Figure 4:
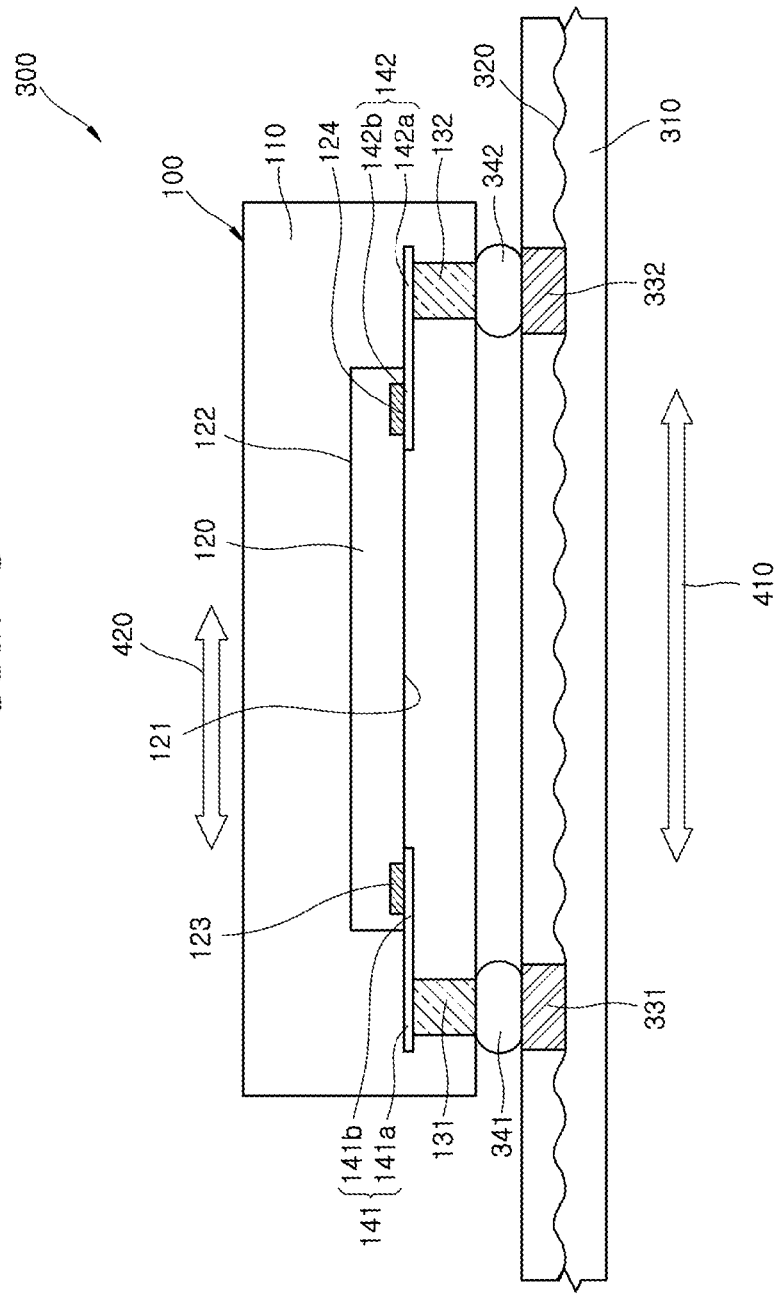
FIG. 4 is a cross-sectional view illustrating a stretched shape of the semiconductor device shown in FIG. 3.

FIG. 4 is a cross-sectional view illustrating a stretched shape of the semiconductor device 300 shown in FIG. 3. In FIG. 4, the same reference numerals used in FIG. 3 denote the same elements. Referring to FIG. 4, if a tensile force is applied to both ends of the substrate 310 in opposite horizontal directions 410, the substrate 310 may extend in the opposite horizontal directions 410. In such a case, a tensile force may also be applied to both ends of the semiconductor package 100, which may be attached to the substrate 310 using a soldering technique, in opposite horizontal directions 420. Accordingly, as described with reference to FIG. 2, the molding member 110 may extend in the horizontal direction so that a warped shaped chip 120 is straightened to have a flat form. As a result, the semiconductor device 300 may be stretched in the horizontal direction.

Figure 5:
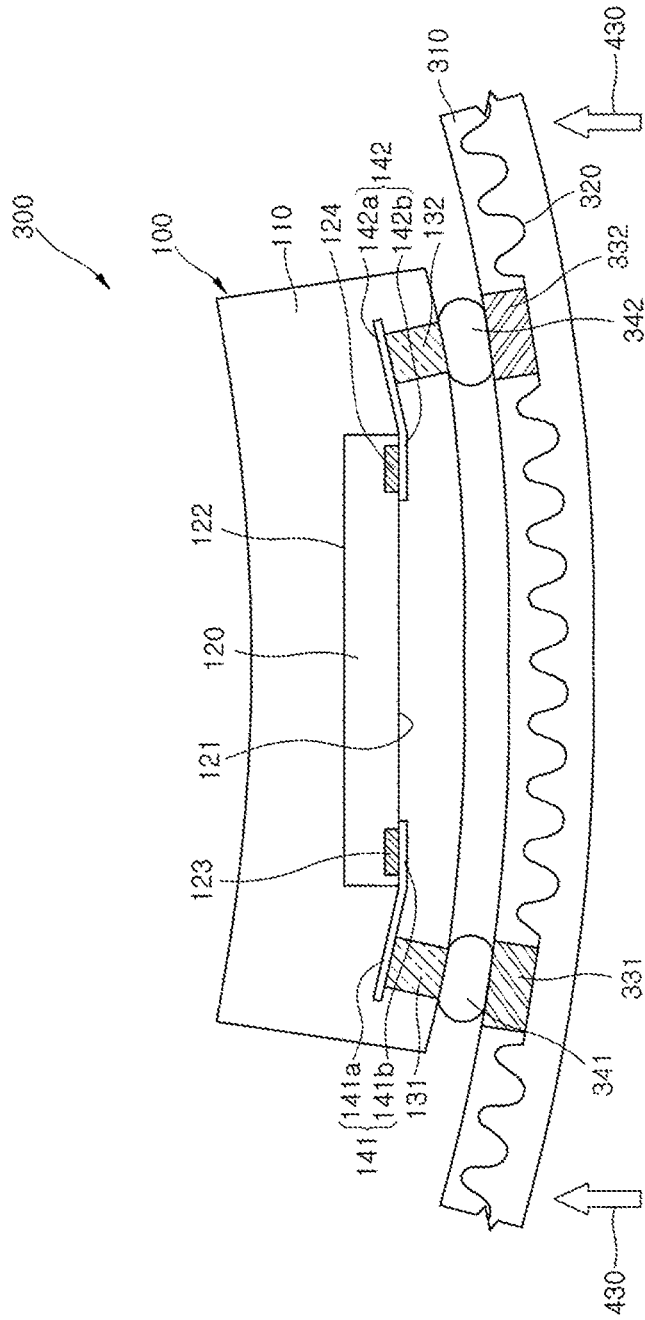
FIG. 5 is a cross-sectional view illustrating a warped shape of the semiconductor device shown in FIG. 3.

FIG. 5 is a cross-sectional view illustrating a warped shape of the semiconductor device 300 shown in FIG. 3. In FIG. 5, the same reference numerals used in FIG. 3 denote the same elements. Referring to FIG. 5, if an external force is applied to both ends of the substrate 310 in an upward direction 430, both ends of the substrate 310 may warp upwardly so that the substrate 310 has a smile shape. In such a case, the semiconductor package 100, which may be attached to the substrate 310 using a soldering technique, may also warp to have the same shape as the substrate 310. As a result, the chip 120 in the molding member 110 may be straightened to have a flat form.

Figure 6:
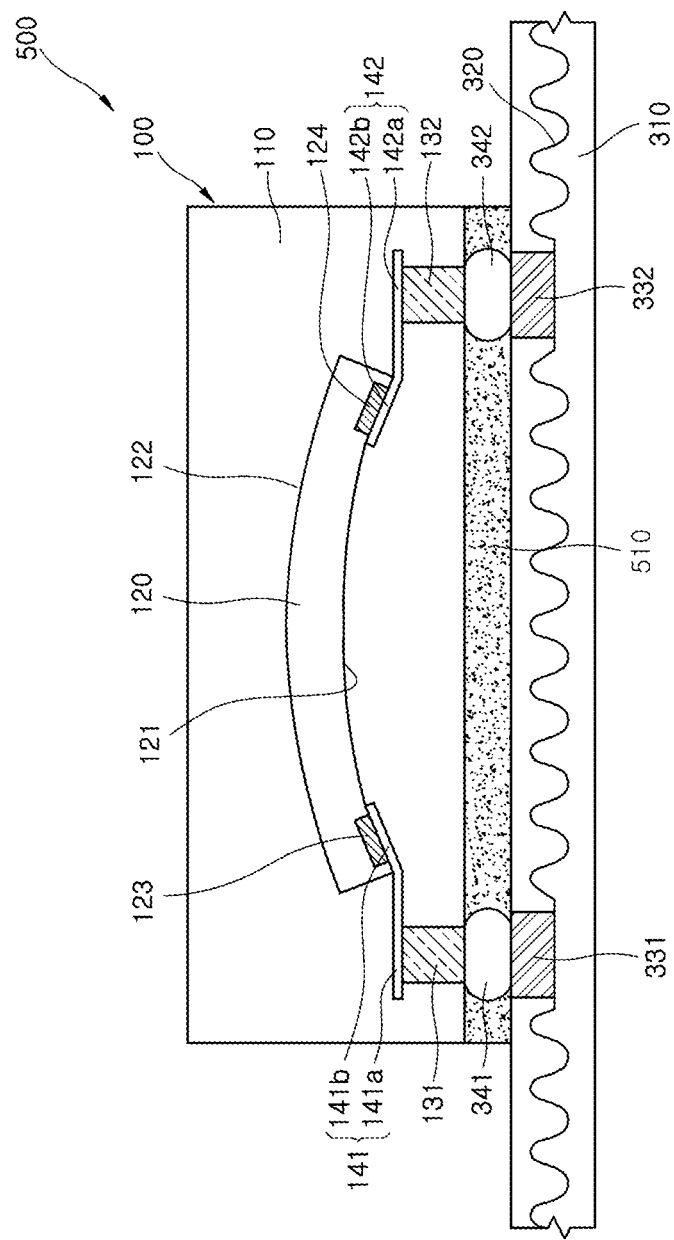
FIG. 6 is a cross-sectional view illustrating another semiconductor device including the semiconductor package shown in FIG. 1.

FIG. 6 is a cross-sectional view illustrating another semiconductor device 500 including the semiconductor package 100 shown in FIG. 1. In FIG. 6, the same reference numerals used in FIG. 1 denote the same elements. Thus, to avoid duplicate explanation, description of the same elements as set forth with reference to FIG. 1 will be omitted or briefly mentioned hereinafter. Referring to FIG. 6, the semiconductor device 500 may be configured to include an underfill layer 510 disposed between the semiconductor package 100 and the substrate 310. The underfill layer 510 may be comprised of an extendible or stretchable material. Alternatively, the underfill layer 510 may be comprised of an extendible and flexible material. In an embodiment, the underfill layer 510 may be comprised of substantially the same material as the molding member 110 or the substrate 310. A bottom surface and a top surface of the underfill layer 510 may be attached to a top surface of the substrate 310 and a bottom surface of the molding member 110, respectively.

The underfill layer 510 may be disposed to surround and attach to sidewalls of the first and second joint electrodes 341 and 342. When the semiconductor device 500 extends or warps, the underfill layer 510 may also extend or warp. In such a case, the underfill layer 510 may improve coherence between the semiconductor package 100 and the substrate 310. In addition, the underfill layer 510 may enhance a combination strength between the first connectors 131, the first conductive patterns 331 and the first joint electrodes 341 as well as a combination strength between the second connectors 132, the second conductive patterns 332 and the second joint electrodes 342.

Figure 7:
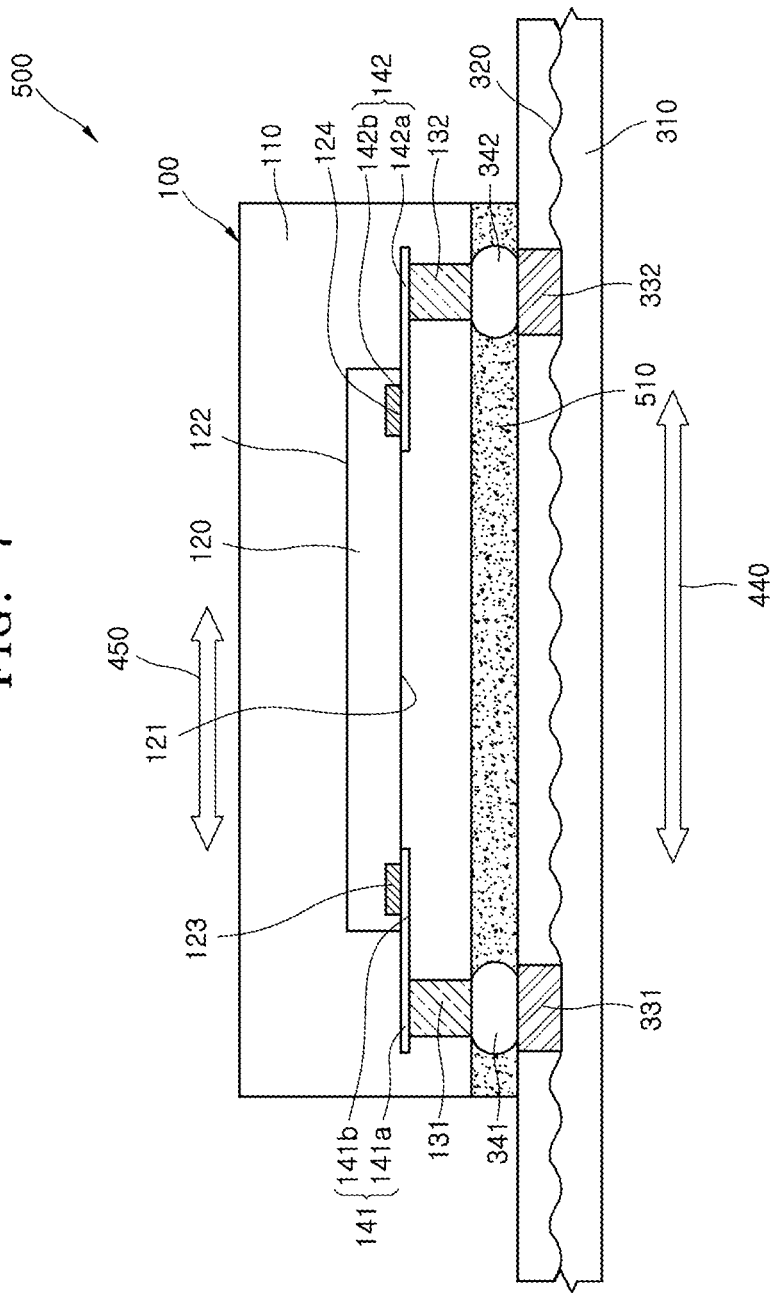
FIG. 7 is a cross-sectional view illustrating a stretched shape of the semiconductor device shown in FIG. 6.

FIG. 7 is a cross-sectional view illustrating a stretched shape of the semiconductor device 500 shown in FIG. 6. In FIG. 7, the same reference numerals used in FIG. 6 denote the same elements. Referring to FIG. 7, if a tensile force is applied to both ends of the substrate 310 in opposite horizontal directions 440, the substrate 310 may extend in a horizontal direction. In such a case, a tensile force may also be applied to both ends of the semiconductor package 100 and both ends of the underfill layer 510 may extend in opposite horizontal directions 450. Accordingly, as described with reference to FIG. 2, the molding member 110 may extend in the horizontal direction so that a warped shaped chip 120 gets straightened to a flat form. When the substrate 310 extends in the horizontal direction, the underfill layer 510 may also extend in the horizontal direction to increase the tensile force applied to the semiconductor package 100. Accordingly, the semiconductor device 500 may be more readily stretched in the horizontal direction.

Figure 8:
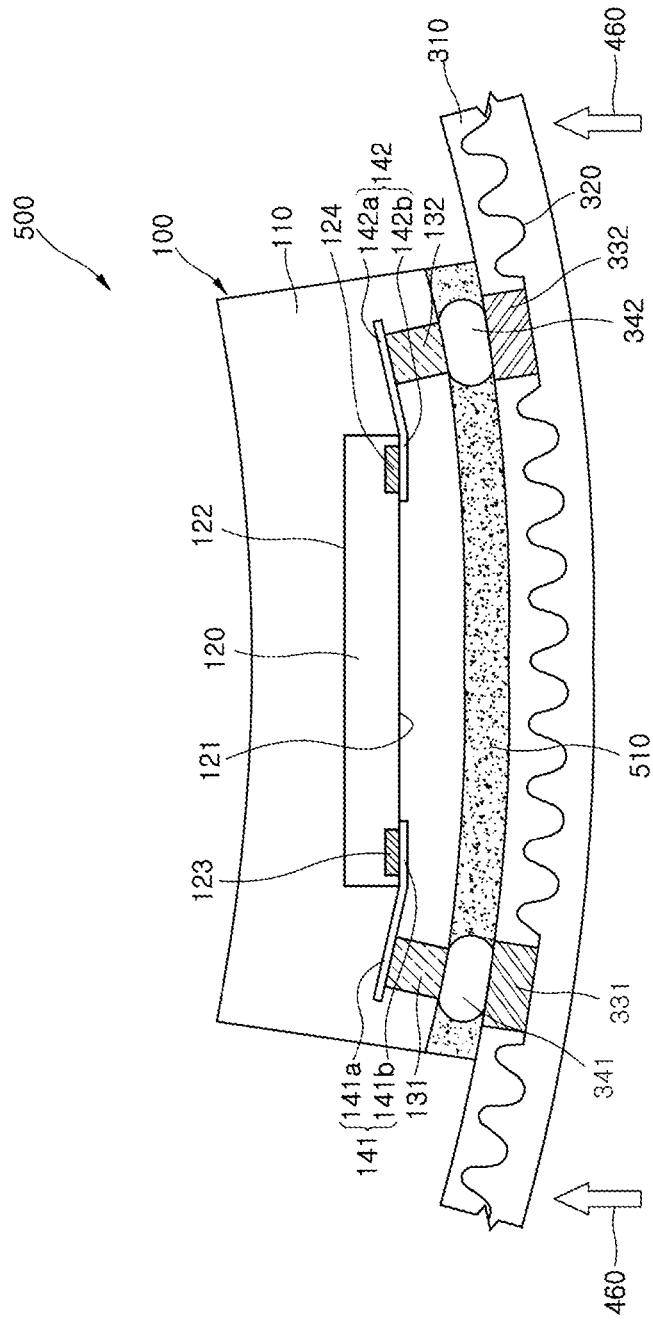
FIG. 8 is a cross-sectional view illustrating a warped shape of the semiconductor device shown in FIG. 6.

FIG. 8 is a cross-sectional view illustrating a warped shape of the semiconductor device 500 shown in FIG. 6. In FIG. 8, the same reference numerals used in FIG. 6 denote the same elements. Referring to FIG. 8, if an external force is applied to both ends of the substrate 310 in an upward direction 460, both ends of the substrate 310 may warp upwardly so that the substrate 310 and the underfill layer 510 have a smile shape. In such a case, the semiconductor package 100 may also warp to have the same shape as the substrate 310 and the underfill layer 510. As a result, the chip 120 having a warped shape in a straight or flat molding member 110 may be straightened to have a flat form.

Figure 9:
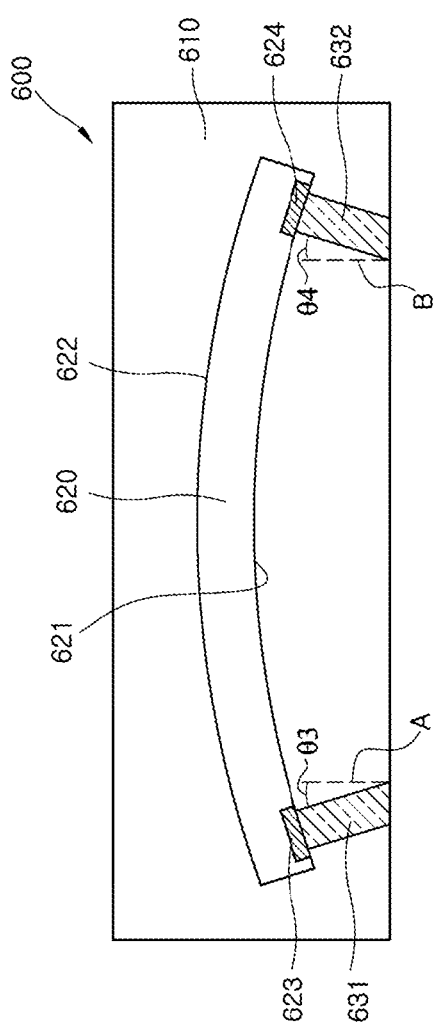
FIG. 9 is a cross-sectional view illustrating a stretchable semiconductor package according to another embodiment.

FIG. 9 is a cross-sectional view illustrating a stretchable semiconductor package 600 according to another embodiment. Referring to FIG. 9, the semiconductor package 600 may be configured to include a chip 620 embedded in a molding member 610. The molding member 610 may be comprised of an extendible material. The extendible material used as the molding member 610 may include a polymer-based material. The polymer-based material may include a polydimethylsiloxane (PDMS) material, a polyethylene-terephthalate (PET) material, a polyimide (PI) material, or a silicone material. The material used as the molding member 610 may include a flexible material in addition to the extendible material. The chip 620 may be a semiconductor chip including active elements (e.g., transistors) and/or passive elements (e.g., resistors, capacitors or inductors) which are realized in and/or on a semiconductor substrate. The chip 620 may be embedded in the molding member 610 in a warped shape. The chip 620 may be thinly fabricated to have a naturally warped shape. In an embodiment, the chip 620 may have a thickness of about 50 micrometers or less. The chip 620 may have a first surface 621 and a second surface 622 which are opposite to each other. First contact pads 623 and second contact pads 624 may be disposed on or in the first surface 621 of the chip 620. The first contact pads 623 and the second contact pads 624 may be disposed on both ends of the first surface 621 of the chip 620, respectively. In an embodiment, the first contact pads 623 may be disposed on a left end of the chip 620, and the second contact pads 624 may be disposed on a right end of the chip 620. The chip 620 may be a flip chip. That is, the chip 620 may be disposed in the molding member 610 so that the first surface 621 of the chip 620 faces downward. The chip 620 may be disposed in the molding member 610 to have a crying shape. That is, both ends of the chip 620 may bend in a downward direction so that the second surface 622 of the chip 620 has a convex shape.

First connectors 631 and second connectors 632 may be disposed in the molding member 610. In an embodiment, first surfaces (i.e., bottom surfaces in the drawing) of the first and second connectors 631 and 632 may be exposed at a bottom surface of the molding member 610. Second surfaces of the first and second connectors 631 and 632 may be coupled to the chip 620 via the first and second contact pads 623 and 624. Sidewalls and top surfaces of the first and second connectors 631 and 632 may be surrounded by the molding member 610. In an embodiment, the first and second connectors 631 and 632 may be bumps. Top surfaces of the first connectors 631 may be attached to the first contact pads 623, respectively. Top surfaces of the second connectors 632 may be attached to the second contact pads 624, respectively. The first connectors 631 and the second connectors 632 may be disposed to be inclined at a certain angle. That is, the first connectors 631 may be inclined at a first tilt angle θ3 with respect to a vertical line A, and the second connectors 632 may be inclined at a second tilt angle θ4 with respect to a vertical line B. The first and second tilt angles θ3 and θ4 may be determined by a curvature of the chip 620. Although not shown in FIG. 9, a conductive adhesion material may be disposed between the first connector 631 and the first contact pad 623 as well as between the second connector 632 and the second contact pad 624.

Figure 10:
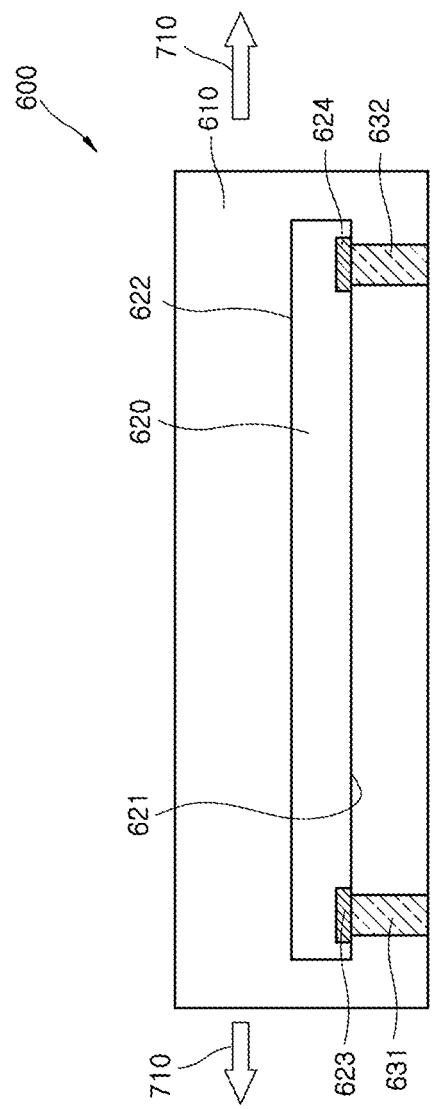
FIG. 10 is a cross-sectional view illustrating a stretched shape of the semiconductor package shown in FIG. 9.

FIG. 10 is a cross-sectional view illustrating a stretched shape of the semiconductor package 600 shown in FIG. 9. In FIG. 10, the same reference numerals used in FIG. 9 denote the same elements. Referring to FIG. 10, if a tensile force is applied to both ends of the semiconductor package 600 in opposite horizontal directions 710, the molding member 610 may extend in a horizontal direction. As a result, a vertical thickness of the molding member 610 may be reduced compared to an initial thickness of the molding member 610, and a horizontal length of the molding member 610 may increase compared to an initial length of the molding member 610. Accordingly, the chip 620 having a warped shape may be straightened. Thus, the first connectors 631 may move in a leftward direction to be substantially vertical, and the second connectors 632 may move in a rightward direction to be substantially vertical. In such a case, a tensile stress in the leftward direction and the rightward direction as well as a pressure in a downward direction may be applied to the chip 620 so that a warped shape chip 620 gets straightened to have a flat form. If the chip 620 gets straightened to have a flat form, the first connectors 631 and the second connectors 632 may be vertically erect.

Figure 11:
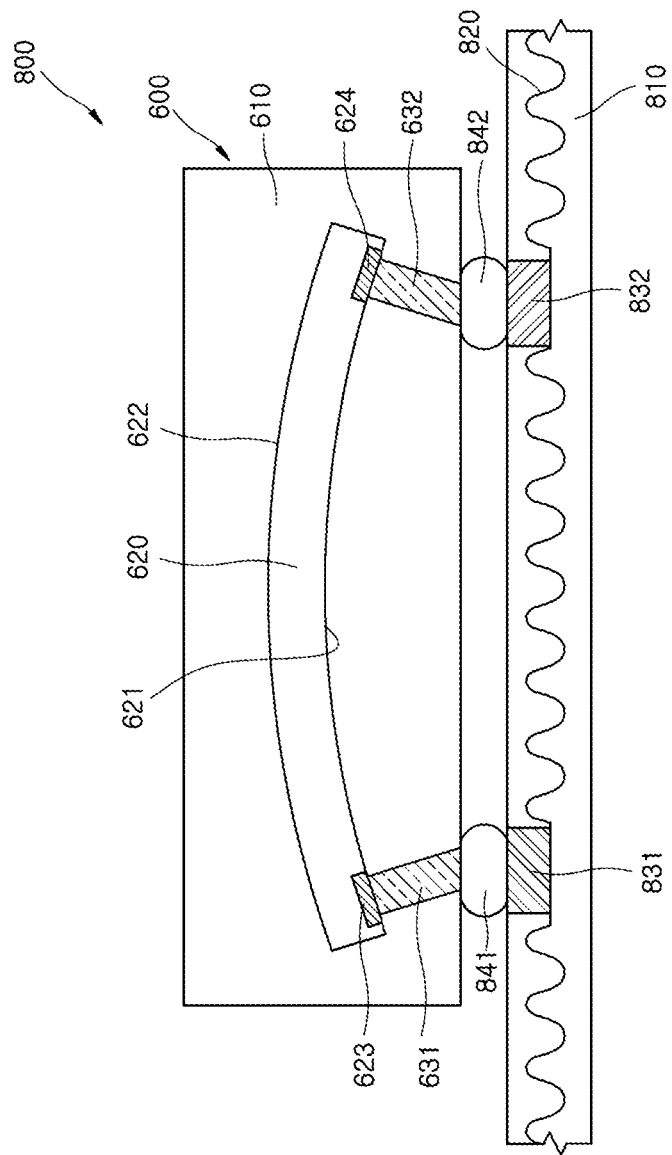
FIG. 11 is a cross-sectional view illustrating a semiconductor device including the semiconductor package shown in FIG. 9.

FIG. 11 is a cross-sectional view illustrating a semiconductor device 800 including the semiconductor package 600 shown in FIG. 9. In FIG. 11, the same reference numerals used in FIG. 9 denote the same elements. Thus, to avoid duplicate explanation, description of the same elements as set forth with reference to FIG. 9 will be omitted or briefly mentioned hereinafter. Referring to FIG. 11, the semiconductor device 800 may include the semiconductor package 600 described with reference to FIG. 9 and a substrate 810 on which the semiconductor package 600 is mounted. In the present embodiment, the substrate 810 may be a printed circuit board (PCB). For example, the substrate 810 may be a motherboard constituting an electronic system. The substrate 810 may be comprised of a flexible and extendible material. The flexible and extendible material used as the substrate 810 may include a polymer-based material. In an embodiment, the polymer-based material may include a polydimethylsiloxane (PDMS) material, a poly-ethylene-terephthalate (PET) material, a polyimide (PI) material, or a silicone material. Interconnection lines 820 may be disposed in the substrate 810. Each of the interconnection lines 820 may be comprised of a conductive material such as a metal material and may have a curved line shape to be extendible or stretchable. In an embodiment, each of the interconnection lines 820 may have a sine wave form and may be disposed along a horizontal direction, for example, a length direction of the substrate 810.

First conductive patterns 831 and second conductive patterns 832 may be disposed in the substrate 810. Sidewalls and bottom surfaces of the first and second conductive patterns 831 and 832 may be surrounded by the substrate 810, and top surfaces of the first and second conductive patterns 831 and 832 may be exposed at a top surface of the substrate 810. The exposed top surfaces of the first conductive patterns 831 may be coupled to the first connectors 631 through first joint electrodes 841, respectively. Similarly, the exposed top surfaces of the second conductive patterns 832 may be coupled to the second connectors 632 through second joint electrodes 842, respectively. Each of the first and second joint electrodes 841 and 842 may be comprised of a conductive material, and may comprise, for example, a metal bump, or a solder ball.

Figure 12:
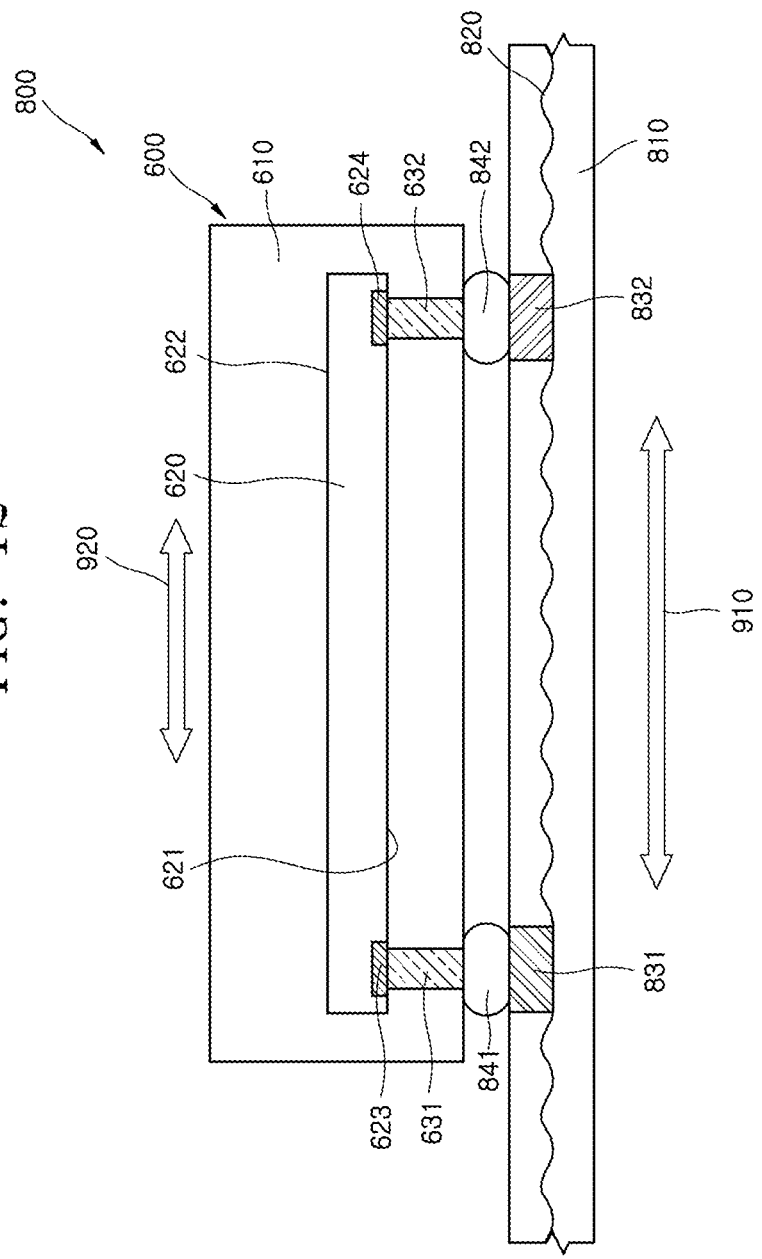
FIG. 12 is a cross-sectional view illustrating a stretched shape of the semiconductor device shown in FIG. 11.

FIG. 12 is a cross-sectional view illustrating a stretched shape of the semiconductor device 800 shown in FIG. 11. In FIG. 12, the same reference numerals used in FIG. 11 denote the same elements. Referring to FIG. 12, if a tensile force is applied to both ends of the substrate 810 in opposite horizontal directions 910, the substrate 810 may extend in a horizontal direction. In such a case, a tensile force may also be applied to both ends of the semiconductor package 600, which may be attached to the substrate 810 using a soldering technique, in opposite horizontal directions 920. Accordingly, as described with reference to FIG. 10, the molding member 610 may extend in the horizontal direction so that the previously warped shaped chip 620 gets straightened to have a flat form. As a result, the semiconductor device 800 may be stretched in the horizontal direction.

Figure 13:
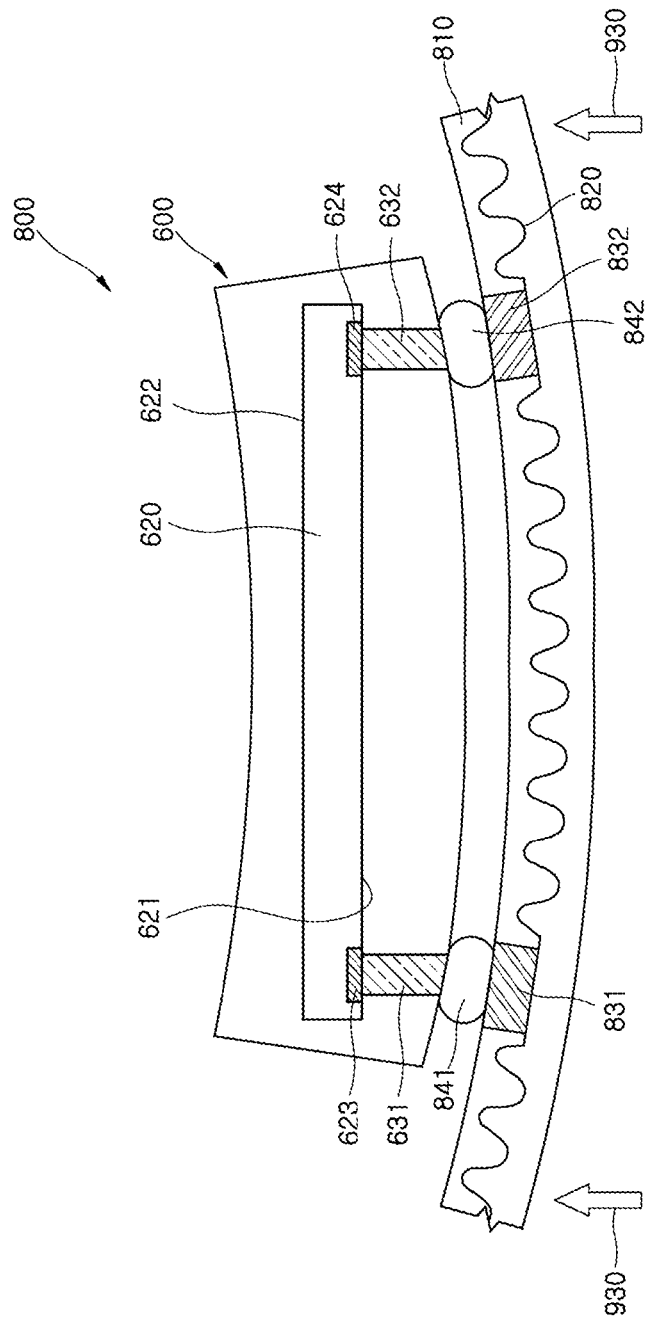
FIG. 13 is a cross-sectional view illustrating a warped shape of the semiconductor device shown in FIG. 11.

FIG. 13 is a cross-sectional view illustrating a warped shape of the semiconductor device 800 shown in FIG. 11. In FIG. 13, the same reference numerals used in FIG. 11 denote the same elements. Referring to FIG. 13, if an external force is applied to both ends of the substrate 810 in an upward direction 930, both ends of the substrate 810 may warp upwardly so that the substrate 810 has a smile shape. In such a case, the semiconductor package 600, which may be attached to the substrate 810 using a soldering technique, may also warp to have the same shape as the substrate 810. As a result, the chip 620 in the molding member 610 may be straightened to have a flat form.

Figure 14:
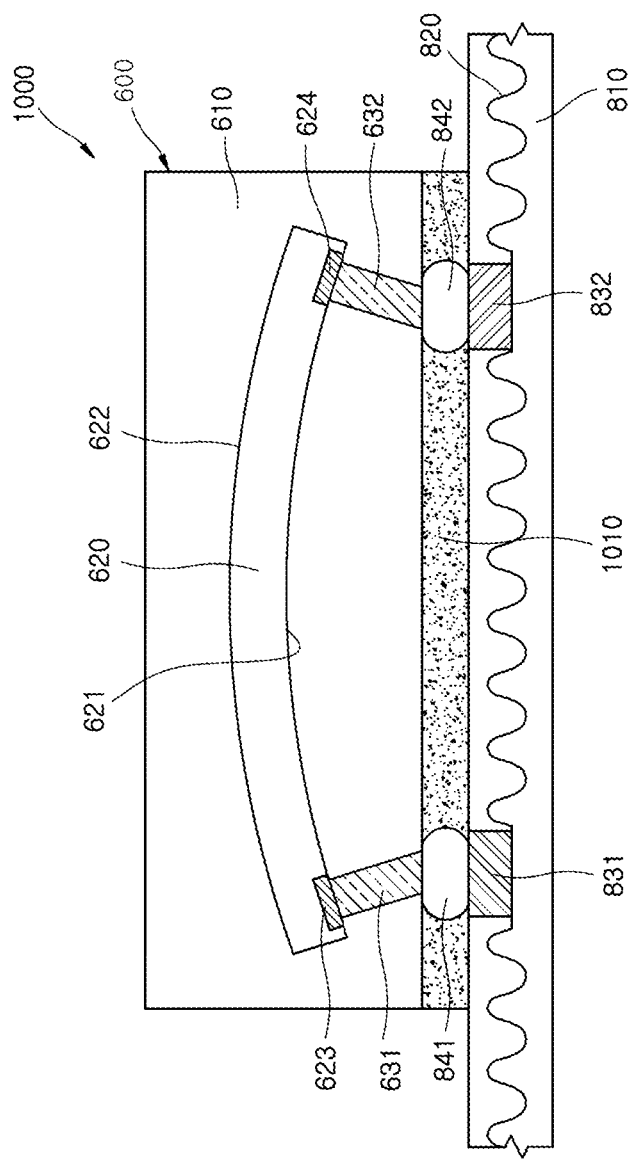
FIG. 14 is a cross-sectional view illustrating another semiconductor device including the semiconductor package shown in FIG. 9.

FIG. 14 is a cross-sectional view illustrating another semiconductor device 1000 including the semiconductor package 600 shown in FIG. 9. In FIG. 14, the same reference numerals used in FIG. 9 denote the same elements. Thus, to avoid duplicate explanation, description of the same elements as set forth with reference to FIG. 9 will be omitted or briefly mentioned hereinafter. Referring to FIG. 14, the semiconductor device 1000 may be configured to include an underfill layer 1010 disposed between the semiconductor package 600 and the substrate 810. The underfill layer 1010 may be comprised of an extendible material or a stretchable material. Alternatively, the underfill layer 1010 may be comprised of an extendible and flexible material. In an embodiment, the underfill layer 1010 may be comprised of substantially the same material as the molding member 610 or the substrate 810. A bottom surface and a top surface of the underfill layer 1010 may be attached to a top surface of the substrate 810 and a bottom surface of the molding member 610, respectively. The underfill layer 1010 may be disposed to surround and attach to sidewalls of the first and second joint electrodes 841 and 842. When the semiconductor device 1000 extends or warps, the underfill layer 1010 may also extend or warp. In such a case, the underfill layer 1010 may improve coherence between the semiconductor package 600 and the substrate 810. In addition, the underfill layer 1010 may enhance a combination strength between the first connectors 631, the first conductive patterns 831, and the first joint electrodes 841 as well as a combination strength between the second connectors 632, the second conductive patterns 832, and the second joint electrodes 842.

Figure 15:
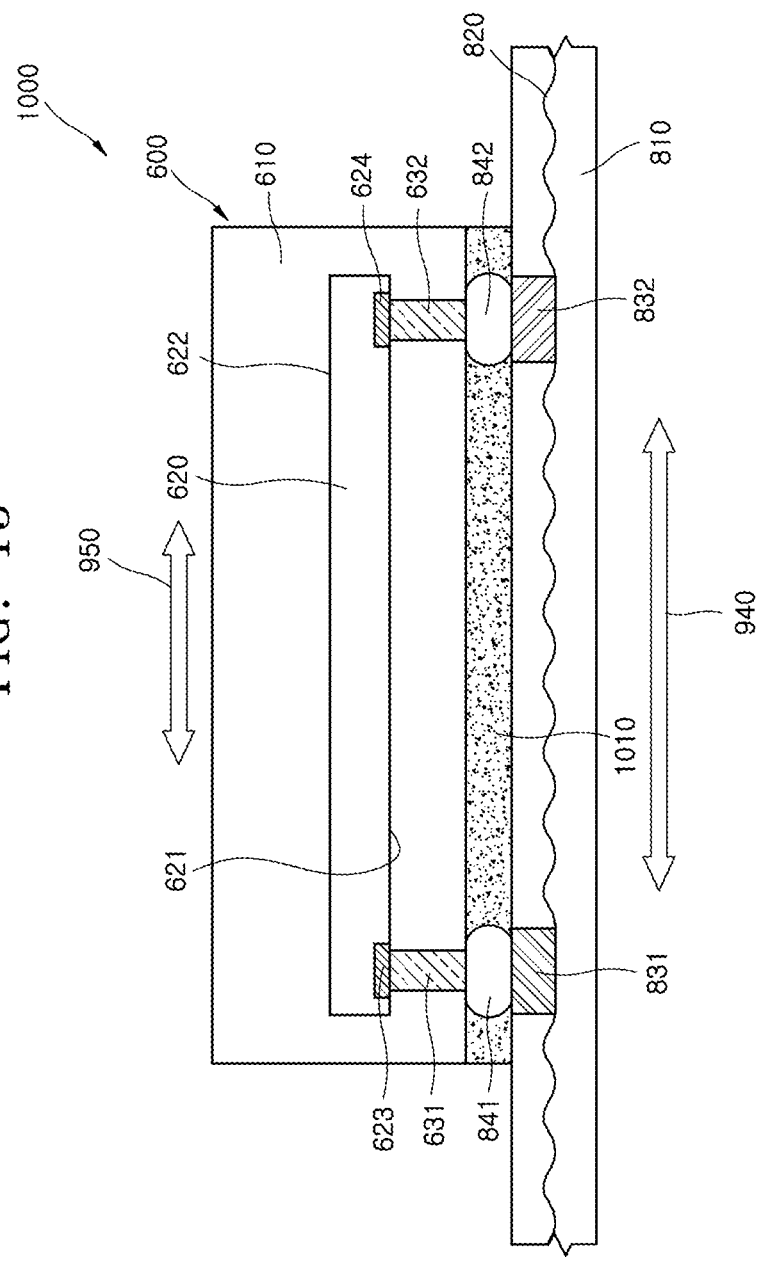
FIG. 15 is a cross-sectional view illustrating a stretched shape of the semiconductor device shown in FIG. 14.

FIG. 15 is a cross-sectional view illustrating a stretched shape of the semiconductor device 1000 shown in FIG. 14. In FIG. 15, the same reference numerals used in FIG. 14 denote the same elements. Referring to FIG. 15, if a tensile force is applied to both ends of the substrate 810 in opposite horizontal directions 940, the substrate 810 may extend in opposite horizontal directions. In such a case, a tensile force may also be applied to both ends of the semiconductor package 600 and both ends of the underfill layer 1010 in opposite horizontal directions 950. Accordingly, as described with reference to FIG. 10, the molding member 610 may extend in the horizontal direction so that the warped shaped chip 620 gets straightened to have a flat form. When the substrate 810 extends in the horizontal direction, the underfill layer 1010 may also extend in the horizontal direction to increase the tensile force applied to the semiconductor package 600. Accordingly, the semiconductor device 1000 may be readily stretched in the horizontal direction.

Figure 16:
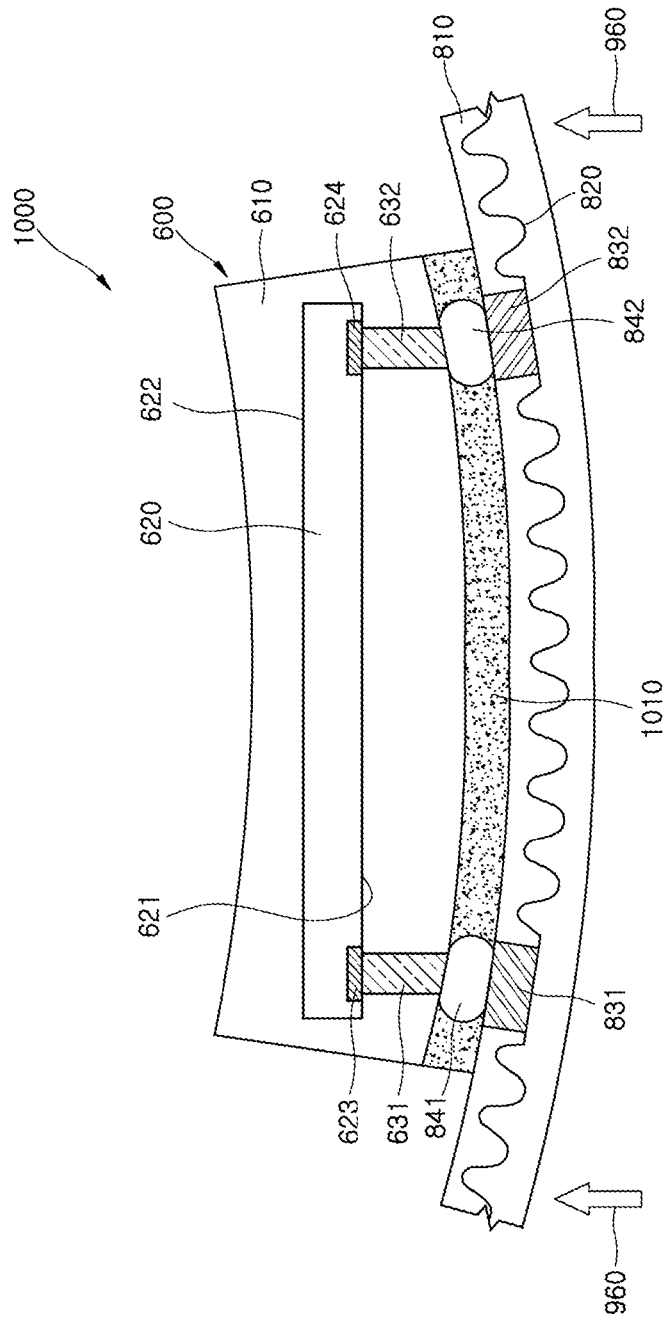
FIG. 16 is a cross-sectional view illustrating a warped shape of the semiconductor device shown in FIG. 14.

FIG. 16 is a cross-sectional view illustrating a warped shape of the semiconductor device 1000 shown in FIG. 14. In FIG. 16, the same reference numerals used in FIG. 14 denote the same elements. Referring to FIG. 16, if an external force is applied to both ends of the substrate 810 in an upward direction 960, both ends of the substrate 810 may warp upwardly so that the substrate 810 and the underfill layer 1010 have a smile shape. In such a case, the semiconductor package 600 may also warp to have the same shape as the substrate 810 and the underfill layer 1010. As a result, the warped shaped chip 620 in the molding member 610 may be straightened to have a flat form.

Figure 17:
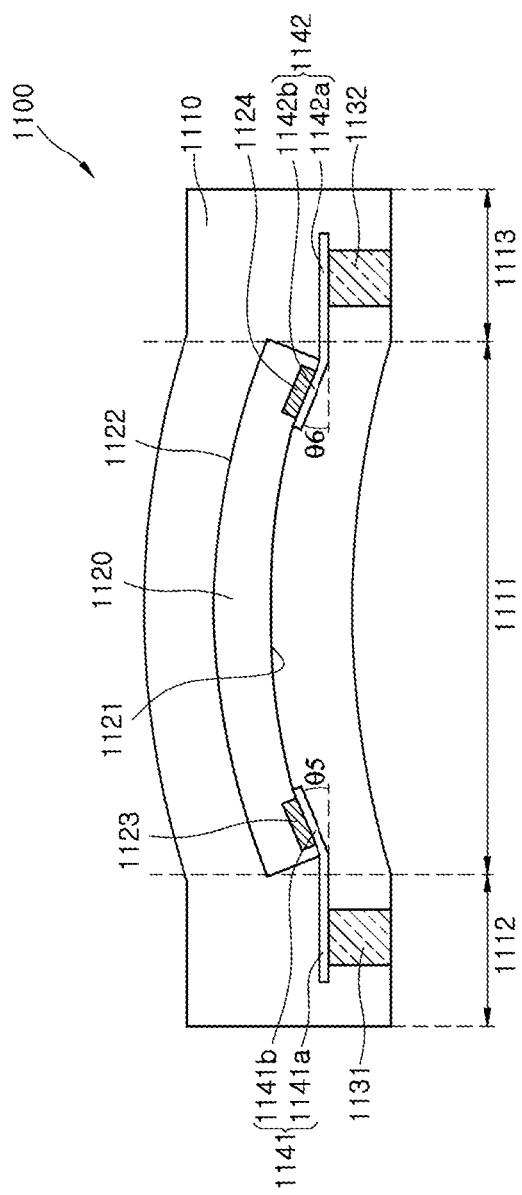
FIG. 17 is a cross-sectional view illustrating a stretchable semiconductor package according to yet another embodiment.

FIG. 17 is a cross-sectional view illustrating a stretchable semiconductor package 1100 according to yet another embodiment. Referring to FIG. 17, the semiconductor package 1100 may be configured to include a chip 1120 embedded in a molding member 1110. The molding member 1110 may be comprised of an extendible material. The extendible material used as the molding member 1110 may include a polymer-based material. The polymer-based material may include a polydimethylsiloxane (PDMS) material, a poly-ethylene-terephthalate (PET) material, a polyimide (PI) material, or a silicone material. The material used as the molding member 1110 may include a flexible material in addition to the extendible material. The molding member 1110 may include a first part 1111 having a warped shape, a second part 1112 extending from one end of the first part 1111 to have a flat form, and a third part 1113 extending from the other end of the first part 1111 to have a flat form. Both ends of the first part 1111 of the chip 1120 may bend in a downward direction to be located at a lower level than a central portion of the first part 1111 of the chip 1120. For example, the first part 1111 of the molding member 1110 may have a crying shape, as illustrated.

The chip 1120 may be a semiconductor chip including active elements (e.g., transistors) and/or passive elements (e.g., resistors, capacitors or inductors) which are realized in and/or on a semiconductor substrate. The chip 1120 may be embedded in the molding member 1110 in a warped shape. The chip 1120 may be thinly fabricated to have a naturally warped shape. In an embodiment, the chip 1120 may have a thickness of about 50 micrometers or less. The chip 1120 may have a first surface 1121 and a second surface 1122 which are opposite to each other. First contact pads 1123 and second contact pads 1124 may be disposed on or in the first surface 1121 of the chip 1120. The first contact pads 1123 and the second contact pads 1124 may be disposed on both ends of the first surface 1121 of the chip 1120, respectively. In an embodiment, the first contact pads 1123 may be disposed on a left end of the chip 1120, and the second contact pads 1124 may be disposed on a right end of the chip 1120. The chip 1120 may be a flip chip. That is, the chip 1120 may be disposed in the molding member 1110 so that the first surface 1121 of the chip 1120 faces downward. The chip 1120 may be disposed in the molding member 1110 to have a crying shape. That is, both ends of the chip 1120 may bend in a downward direction so that the second surface 1122 of the chip 1120 has a convex shape.

First connectors 1131 and second connectors 1132 may be disposed in the molding member 1110. Particularly, the first connectors 1131 may be disposed in the second part 1112 of the molding member 1110, and the second connectors 1132 may be disposed in the third part 1113 of the molding member 1110. In an embodiment, first surfaces (i.e., bottom surfaces in the drawing) of the first connectors 1131 may be exposed at a bottom surface of the second part 1112 of the molding member 1110, and first surfaces (i.e., bottom surfaces in the drawing) of the second connectors 1132 may be exposed at a bottom surface of the third part 1113 of the molding member 1110. Second surfaces of the first and second connectors 1131 and 1132 may be coupled to the chip 1120 via first and second interconnectors 1141 and 1142. Sidewalls and top surfaces of the first and second connectors 1131 and 1132 may be surrounded by the molding member 1110. In an embodiment, the first and second connectors 1131 and 1132 may be bumps.

Each of the first contact pads 1123 may be electrically connected to one of the first connectors 1131 through one of first interconnectors 1141. The first interconnectors 1141 may be disposed in the second part 1112 of the molding member 1110 and may extend into the first part 1111 of the molding member 1110. Each of the second contact pads 1124 may be electrically connected to one of the second connectors 1132 through one of second interconnectors 1142. The second interconnectors 1142 may be disposed in the third part 1113 of the molding member 1110 and may extend into the first part 1111 of the molding member 1110. The first and second interconnectors 1141 and 1142 may electrically connect the chip 1120 to the first and second connectors 1131 and 1132. Each of the first and second interconnectors 1141 and 1142 may be a plate-shaped electrode. Specifically, each of the first interconnectors 1141 may include a first horizontal portion 1141a that contacts a top surface of one of the first connectors 1131 and a first inclined portion 1141b that extends from an end of the first horizontal portion 1141a to contact a surface of one of the first contact pads 1123. A first tilt angle $\theta5$ of the first inclined portion 1141b may be substantially equal to the arctangent value of a maximum slope of a left end of the chip 1120, on which the first contact pads 1123 are disposed. Similarly, each of the second interconnectors 1142 may include a second horizontal portion 1142a that contacts a top surface of one of the second connectors 1132 and a second inclined portion 1142b that extends from an end of the second horizontal portion 1142a to contact a surface of one of the second contact pads 1124. A second tilt angle $\theta6$ of the second inclined portion 1142b may be substantially equal to the arctangent value of a maximum slope of a right end of the chip 1120, on which the second contact pads 1124 are disposed. In an embodiment, the first and second interconnectors 1141 and 1142 may be comprised of a metal material. Although not shown in FIG. 17, a first conductive adhesion material may be disposed between the first interconnector 1141 and the first connector 1131 as well as between the first interconnector 1141 and the first contact pad 1123, and a second conductive adhesion material may be disposed between the second interconnector 1142 and the second connector 1132 as well as between the second interconnector 1142 and the second contact pad 1124.

Figure 18:
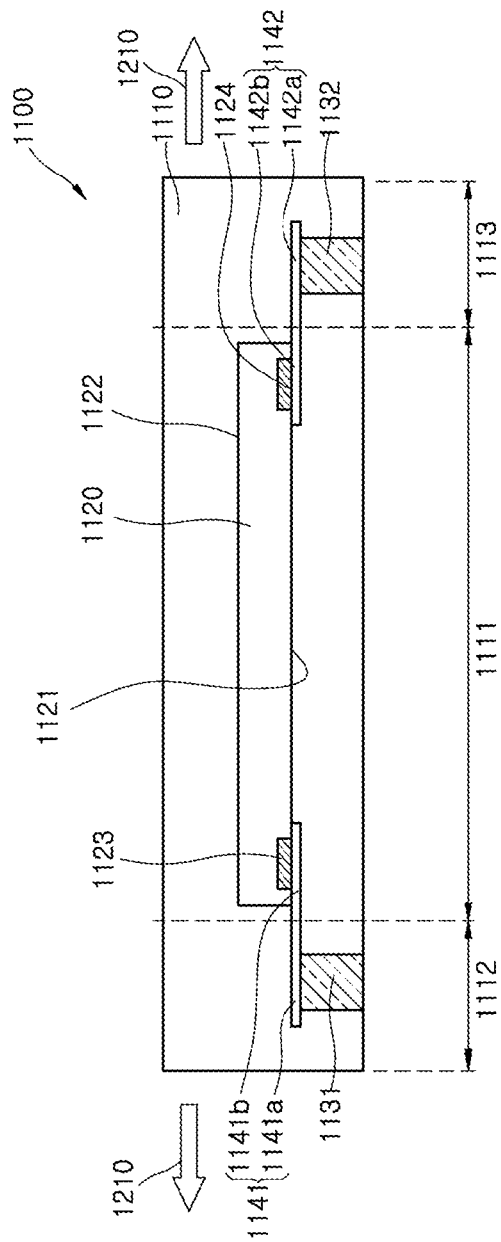
FIG. 18 is a cross-sectional view illustrating a stretched shape of the semiconductor package shown in FIG. 17.

FIG. 18 is a cross-sectional view illustrating a stretched shape of the semiconductor package 1100 shown in FIG. 17. In FIG. 18, the same reference numerals used in FIG. 17 denote the same elements. Referring to FIG. 18, if a tensile force is applied to both ends of the semiconductor package 1100 in opposite horizontal directions 1210, the first part 1111 of the molding member 1110 may extend in a horizontal direction to have a flat form. Accordingly, the warped shaped chip 1120 may be straightened. As the molding member 1110 is stretched in a horizontal direction to have a flat form, the first connectors 1131 and the first interconnectors 1141 may move in a leftward direction, and the second connectors 1132 and the second interconnectors 1142 may move in a rightward direction. In such a case, a tensile stress in the leftward direction and the rightward direction as well as a pressure in a downward direction may be applied to the chip 1120 so that the warped shaped chip 1120 gets straightened to have a flat form. If the chip 1120 gets straightened, the first inclined portion 1141b and the second inclined portion 1142b may also be straightened to be flat. If the semiconductor package 1100 is fully stretched in a horizontal direction, the first inclined portion 1141b and the second inclined portion 1142b may be coplanar with the first and second horizontal portions 1141a and 1142a and may be located at substantially the same level as the first and second horizontal portions 1141a and 1142a. In addition, if the semiconductor package 1100 is fully stretched in a horizontal direction, a bottom surface of the first part 1111 of the molding member 1110 may be straightened to be flat and may be located at substantially the same level so as to be substantially coplanar with bottom surfaces of the second and third parts 1112 and 1113 of the molding member 1110. In such a case, the a top surface of the first part 1111 of the molding member 1110 may also be straightened to be flat and may be located at substantially the same level so as to be substantially coplanar with top surfaces of the second and third parts 1112 and 1113 of the molding member 1110.

Figure 19:
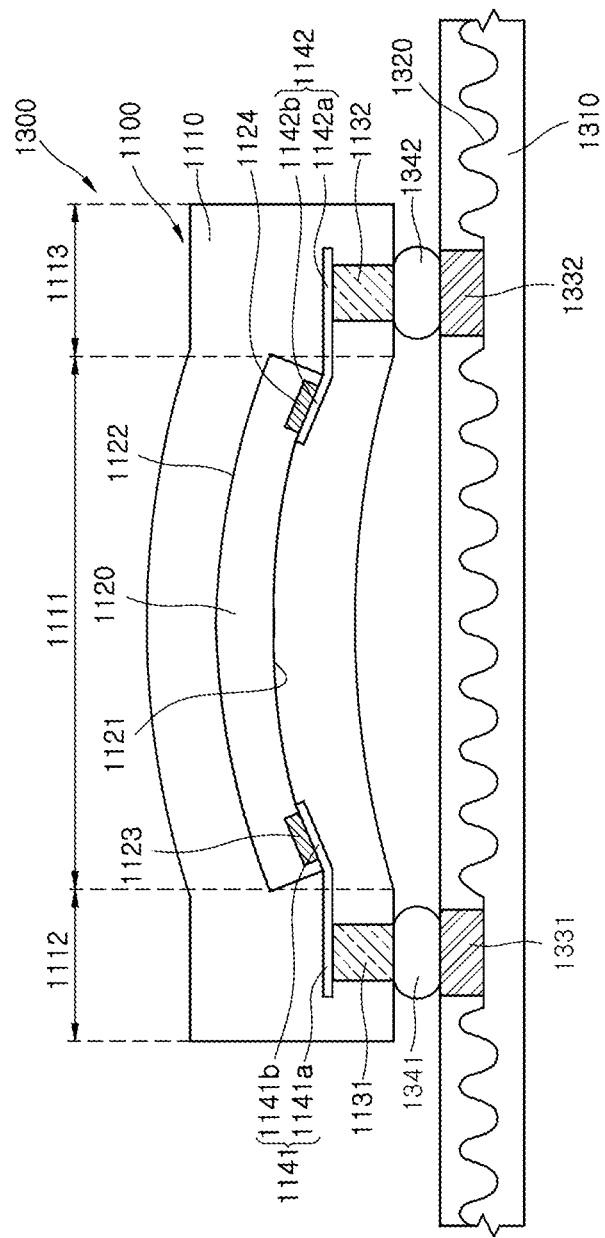
FIG. 19 is a cross-sectional view illustrating a semiconductor device including the semiconductor package shown in FIG. 17.

FIG. 19 is a cross-sectional view illustrating a semiconductor device 1300 including the semiconductor package 1100 shown in FIG. 17. In FIG. 19, the same reference numerals used in FIG. 17 denote the same elements. Thus, to avoid duplicate explanation, description of the same elements as set forth with reference to FIG. 17 will be omitted or briefly mentioned hereinafter. Referring to FIG. 19, the semiconductor device 1300 may include the semiconductor package 1100 described with reference to FIG. 17 and a substrate 1310 on which the semiconductor package 1100 is mounted. In the present embodiment, the substrate 1310 may be a printed circuit board (PCB). For example, the substrate 1310 may be a motherboard constituting an electronic system. The substrate 1310 may be comprised of a flexible and extendible material. The flexible and extendible material used as the substrate 1310 may include a polymer-based material. In an embodiment, the polymer-based material may include a polydimethylsiloxane (PDMS) material, a poly-ethylene-terephthalate (PET) material, a polyimide (PI) material, or a silicone material. Interconnection lines 1320 may be disposed in the substrate 1310. Each of the interconnection lines 1320 may be comprised of a conductive material such as a metal material and may have a curved line shape to be extendible or stretchable. In an embodiment, each of the interconnection lines 1320 may have a sine wave form and may be disposed along a horizontal direction, for example, a length direction of the substrate 1310.

First conductive patterns 1331 and second conductive patterns 1332 may be disposed in the substrate 1310. Sidewalls and bottom surfaces of the first and second conductive patterns 1331 and 1332 may be surrounded by the substrate 1310, and top surfaces of the first and second conductive patterns 1331 and 1332 may be exposed at a top surface of the substrate 1310. The exposed top surfaces of the first conductive patterns 1331 may be coupled to the first connectors 1131 through first joint electrodes 1341, respectively. Similarly, the exposed top surfaces of the second conductive patterns 1332 may be coupled to the second connectors 1132 through second joint electrodes 1342, respectively. Each of the first and second joint electrodes 1341 and 1342 may be comprised of a conductive material, for example, a metal bump, or a solder ball.

Figure 20:
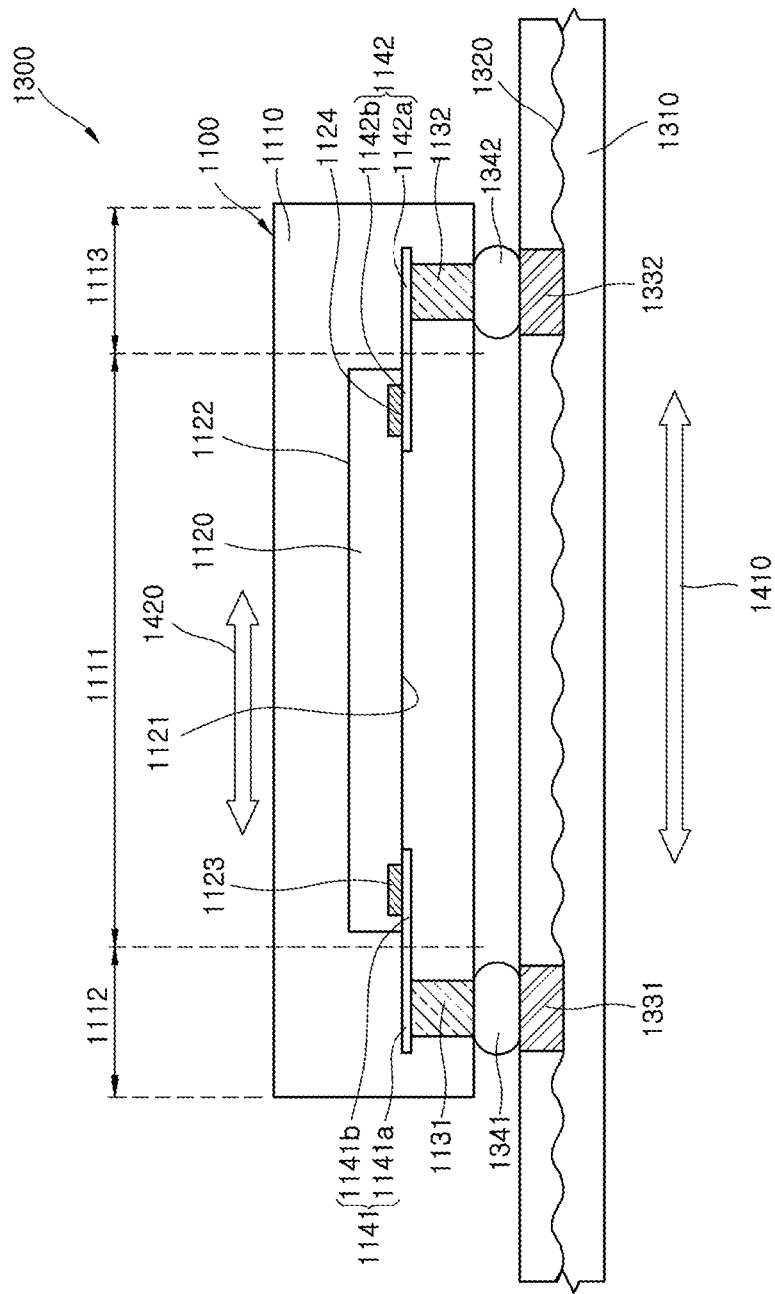
FIG. 20 is a cross-sectional view illustrating a stretched shape of the semiconductor device shown in FIG. 19.

FIG. 20 is a cross-sectional view illustrating a stretched shape of the semiconductor device 1300 shown in FIG. 19. In FIG. 20, the same reference numerals used in FIG. 19 denote the same elements. Referring to FIG. 20, if a tensile force is applied to both ends of the substrate 1310 in opposite horizontal directions 1410, the substrate 1310 may extend in a horizontal direction. In such a case, a tensile force may also be applied to both ends of the semiconductor package 1100, which may be attached to the substrate 1310 using a soldering technique, in opposite horizontal directions 1420. Accordingly, as described with reference to FIG. 18, the molding member 1110 may extend in the horizontal direction so that the warped shaped chip 1120 gets straightened to have a flat form. As a result, the semiconductor device 1300 may be stretched in the horizontal direction.

Figure 21:
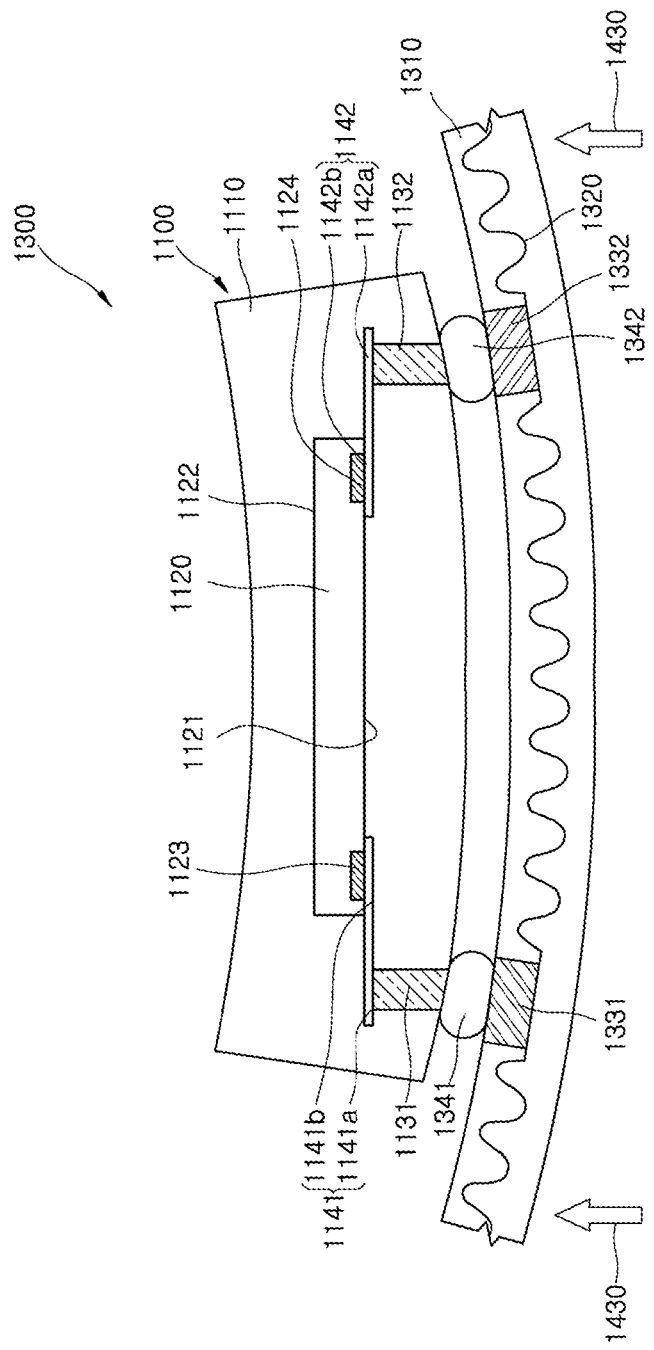
FIG. 21 is a cross-sectional view illustrating a warped shape of the semiconductor device shown in FIG. 19.

FIG. 21 is a cross-sectional view illustrating a warped shape of the semiconductor device 1300 shown in FIG. 19. In FIG. 21, the same reference numerals used in FIG. 19 denote the same elements. Referring to FIG. 21, if an external force is applied to both ends of the substrate 1310 in an upward direction 1430, the both ends of the substrate 1310 may warp upwardly so that the substrate 1310 has a smile shape. In such a case, the semiconductor package 1100, which may be attached to the substrate 1310 using a soldering technique, may also warp to have the same shape as the substrate 1310. As a result, the chip 1120 in the molding member 1110 may be straightened to have a flat form.

Figure 22:
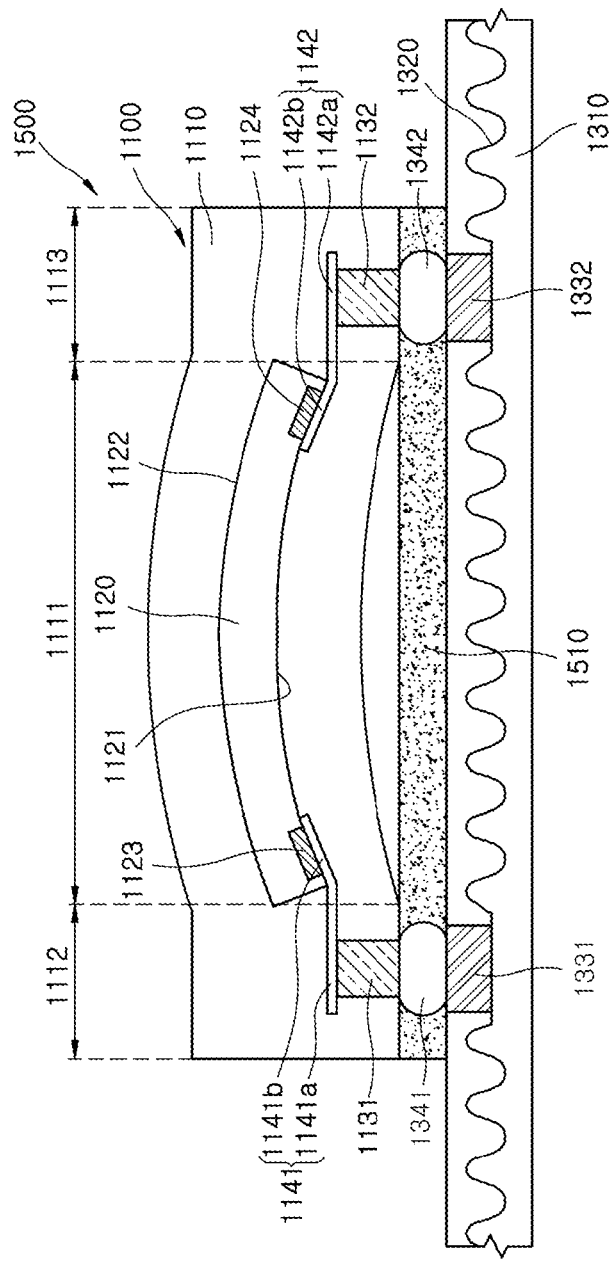
FIG. 22 is a cross-sectional view illustrating another semiconductor device including the semiconductor package shown in FIG. 17.

FIG. 22 is a cross-sectional view illustrating another semiconductor device 1500 including the semiconductor package 1100 shown in FIG. 17. In FIG. 17, the same reference numerals used in FIG. 17 denote the same elements. Thus, to avoid duplicate explanation, description of the same elements as set forth with reference to FIG. 17 will be omitted or briefly mentioned hereinafter. Referring to FIG. 22, the semiconductor device 1500 may be configured to include an underfill layer 1510 disposed between the semiconductor package 1100 and the substrate 1310. The underfill layer 1510 may be comprised of an extendible material or a stretchable material. Alternatively, the underfill layer 1510 may be comprised of an extendible and flexible material. In an embodiment, the underfill layer 1510 may be comprised of substantially the same material as the molding member 1110 or the substrate 1310. A bottom surface of the underfill layer 1510 may be attached to a top surface of the substrate 1310. Both ends of a top surface of the underfill layer 1510 may be attached to bottom surfaces of the second and third parts 1112 and 1113 of the molding member 1110, respectively. A central portion of the top surface of the underfill layer 1510 may be spaced apart from a bottom surface of the first part 1111 of the molding member 1110. The underfill layer 1510 may be disposed to surround and attach to sidewalls of the first and second joint electrodes 1341 and 1342. When the semiconductor device 1500 extends or warps, the underfill layer 1510 may also extend or warp. In such a case, the underfill layer 1510 may improve coherence between the semiconductor package 1100 and the substrate 1310. In addition, the underfill layer 1510 may enhance a combination strength between the first connectors 1131, the first conductive patterns 1331, and the first joint electrodes 1341, as well as a combination strength between the second connectors 1132, the second conductive patterns 1332, and the second joint electrodes 1342.

Figure 23:
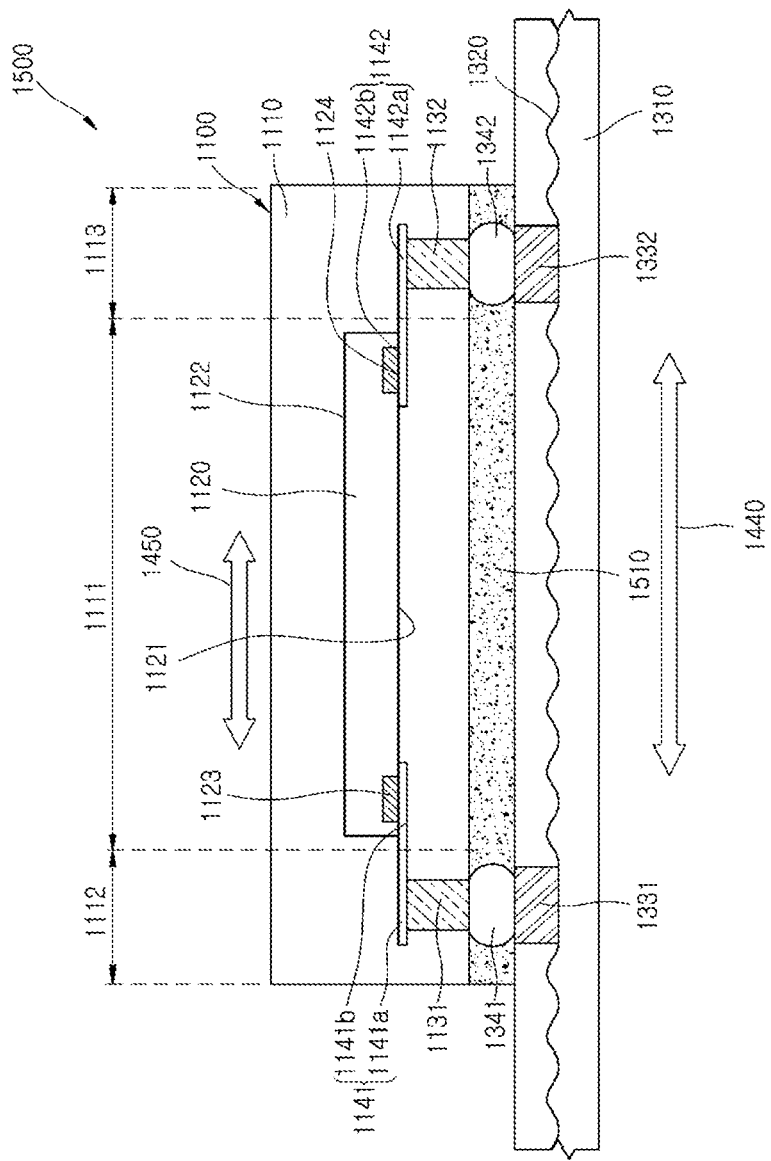
FIG. 23 is a cross-sectional view illustrating a stretched shape of the semiconductor device shown in FIG. 22

FIG. 23 is a cross-sectional view illustrating a stretched shape of the semiconductor device 1500 shown in FIG. 22. In FIG. 23, the same reference numerals used in FIG. 22 denote the same elements. Referring to FIG. 23, if a tensile force is applied to both ends of the substrate 1310 in opposite horizontal directions 1440, the substrate 1310 may extend in a horizontal direction. In such a case, a tensile force may also be applied to both ends of the semiconductor package 1100 and both ends of the underfill layer 1510 in opposite horizontal directions 1450. Accordingly, the underfill layer 1510 may extend in the horizontal direction. In addition, as described with reference to FIG. 18, the first part 1111 of the molding member 1110 may also extend in the horizontal direction so that the warped shaped chip 1120 gets straightened to have a flat form.

Figure 24:
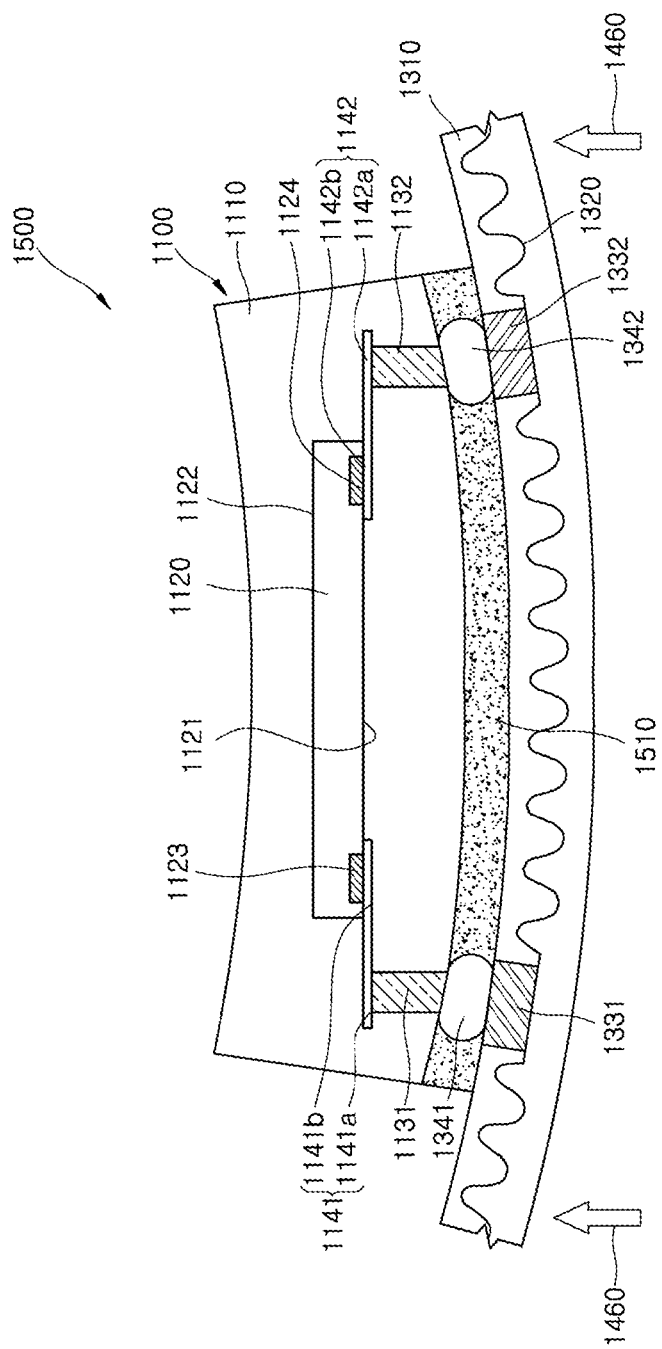
FIG. 24 is a cross-sectional view illustrating a warped shape of the semiconductor device shown in FIG. 22.

FIG. 24 is a cross-sectional view illustrating a warped shape of the semiconductor device 1500 shown in FIG. 22. In FIG. 24, the same reference numerals used in FIG. 22 denote the same elements. Referring to FIG. 24, if an external force is applied to both ends of the substrate 1310 in an upward direction 1460, both ends of the substrate 1310 may warp upwardly so that the substrate 1310 and the underfill layer 1510 have a smile shape. In such a case, the semiconductor package 1100 may also warp to have the same shape as the substrate 1310 and the underfill layer 1510. As a result, the warped shaped chip 1120 in the molding member 1110 may be straightened to have a flat form.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

The stretchable semiconductor package (see FIGS. 1-24) are particular useful in the design of memory devices, processors, and computer systems. For example, referring to FIG. 25, a block diagram of a system employing a stretchable semiconductor package in accordance with the various embodiments are illustrated and generally designated by a reference numeral 2000. The system 2000 may include one or more processors (i.e., Processor) or, for example but not limited to, central processing units ("CPUs") 2100. The processor (i.e., CPU) 2100 may be used individually or in combination with other processors (i.e., CPUs). While the processor (i.e., CPU) 2100 will be referred to primarily in the singular, it will be understood by those skilled in the art that a system 2000 with any number of physical or logical processors (i.e., CPUs) may be implemented.

A chipset 2150 may be operably coupled to the processor (i.e., CPU) 2100. The chipset 2150 is a communication pathway for signals between the processor (i.e., CPU) 2100 and other components of the system 2000. Other components of the system 2000 may include a memory controller 2200, an input/output ("I/O") bus 2250, and a disk driver controller 2300. Depending on the configuration of the system 2000, any one of a number of different signals may be transmitted through the chipset 2150, and those skilled in the art will appreciate that the routing of the signals throughout the system 2000 can be readily adjusted without changing the underlying nature of the system 2000.

As stated above, the memory controller 2200 may be operably coupled to the chipset 2150. The memory controller 2200 may include at least one stretchable semiconductor package discussed above with reference to FIGS. 1-24. Thus, the memory controller 2200 can receive a request provided from the processor (i.e., CPU) 2100, through the chipset 2150. In alternate embodiments, the memory controller 2200 may be integrated into the chipset 2150. The memory controller 2200 may be operably coupled to one or more memory devices 2350. In an embodiment, the memory devices 2350 may include the at least one stretchable semiconductor package as discussed above with relation to FIGS. 1-24, the memory devices 2350 may include a plurality of word lines and a plurality of bit lines for defining a plurality of memory cells. The memory devices 2350 may be any one of a number of industry standard memory types, including but not limited to, single inline memory modules ("SIMMs") and dual inline memory modules ("DIMMs"). Further, the memory devices 2350 may facilitate the safe removal of the external data storage devices by storing both instructions and data.

The chipset 2150 may also be coupled to the I/O bus 2250. The I/O bus 2250 may serve as a communication pathway for signals from the chipset 2150 to I/O devices 2410, 2420, and 2430. The I/O devices 2410, 2420, and 2430 may include, for example but are not limited to, a mouse 2410, a video display 2420, or a keyboard 2430. The I/O bus 2250 may employ any one of a number of communications protocols to communicate with the I/O devices 2410, 2420, and 2430. In an embodiment, the I/O bus 2250 may be integrated into the chipset 2150.

The disk driver controller 2300 may be operably coupled to the chipset 2150. The disk driver controller 2300 may serve as the communication pathway between the chipset 2150 and one internal disk driver 2450 or more than one internal disk driver 2450. The internal disk driver 2450 may facilitate disconnection of the external data storage devices by storing both instructions and data. The disk driver controller 2300 and the internal disk driver 2450 may communicate with each other or with the chipset 2150 using virtually any type of communication protocol, including, for example but not limited to, all of those mentioned above with regard to the I/O bus 2250.

It is important to note that the system 2000 described above in relation to FIG. 25 is merely one example of a system 2000 employing a stretchable semiconductor package as discussed above with relation to FIGS. 1-24. In alternate embodiments, such as, for example but not limited to, cellular phones or digital cameras, the components may differ from the embodiments illustrated in FIG. 25.

Figure 25:
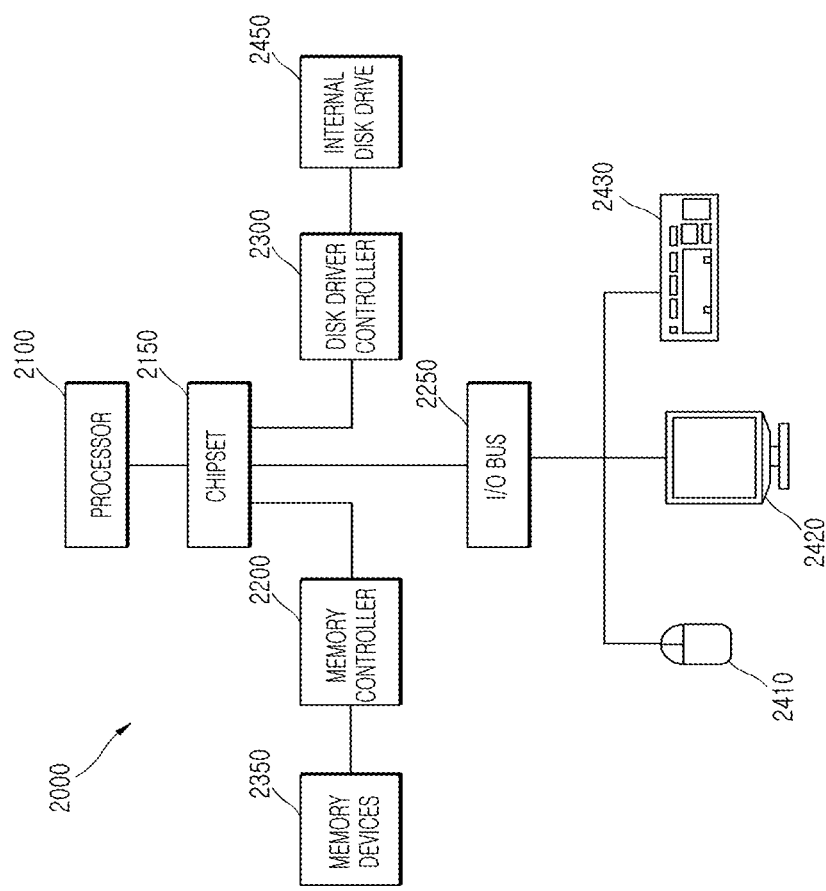
FIG. 25 illustrates a block diagram of an example of a representation of a system employing a stretchable semiconductor package in accordance with the various embodiments discussed above with relation to FIGS. 1-24.

FIG. 25 illustrates a block diagram of an example of a representation of a system employing stretchable semiconductor devices in accordance with the various embodiments discussed above with relation to FIGS. 1-24.

What is claimed is:
1. A semiconductor package comprising:
   a molding member comprised of an extendible material, wherein the molding member includes a first part having a warped shape, a second part extending from one end of the first part to be flat, and a third part extending from the other end of the first part to be flat;
   a chip embedded in the molding member to have a warped shape; and
   connectors disposed in the molding member,
   wherein first surfaces of the connectors are exposed at a surface of the molding member and second surfaces of the connectors are coupled to the chip.

2. The semiconductor package of claim 1, wherein the molding member includes a polymer-based material.

3. The semiconductor package of claim 2, wherein the polymer-based material includes a polydimethylsiloxane (PDMS) material, a poly-ethylene-terephthalate (PET) material, a polyimide (PI) material, or a silicone material.

4. The semiconductor package of claim 1, wherein the first part of the molding member warps so that a central portion of the first part of the molding member is located at a higher level than both ends of the first part of the molding member.

5. The semiconductor package of claim 4, wherein the chip is disposed in the first part of the molding member.

6. The semiconductor package of claim 5, wherein the chip includes contact pads disposed in a first surface of the chip.

7. The semiconductor package of claim 6, wherein the chip is disposed so that the first surface of the chip faces downward.

8. The semiconductor package of claim 7, wherein both ends of the chip bend in a downward direction to be located at a lower level than a central portion of the chip.

9. The semiconductor package of claim 1, wherein each of the connectors comprises a bump.

10. The semiconductor package of claim 1, further comprising interconnectors that electrically connect the chip to the connectors.

11. The semiconductor package of claim 10, wherein each of the interconnectors is a plate-shaped electrode.

12. The semiconductor package of claim 11, wherein each of the interconnectors includes:
   a horizontal portion that contacts the second surface of one of the connectors; and an inclined portion that extends from an end of the horizontal portion to contact one of contact pads of the chip.

13. The semiconductor package of claim 12,
wherein both ends of the chip bend in a downward direction to be located at a lower level than a central portion of the chip; and
wherein a tilt angle of the inclined portion is substantially equal to an arctangent value of a maximum slope of one of the both ends of chip.

14. A semiconductor device comprising:
a substrate comprised of a flexible and extendible material, wherein the substrate includes conductive patterns disposed therein and the conductive patterns are exposed at a surface of the substrate;
a semiconductor package including an extendible molding member, a chip embedded in the molding member to have a warped shape, and connectors disposed in the molding member, wherein first surfaces of the connectors are exposed at a surface of the molding member and second surfaces of the connectors are coupled to the chip; and
joint electrodes connecting the conductive patterns to the connectors,
wherein the molding member includes a first part having a warped shape, a second part extending from one end of the first part to be flat, and a third part extending from the other end of the first part to be flat.

15. The semiconductor device of claim 14, wherein the substrate further includes interconnection lines disposed therein.

16. The semiconductor device of claim 15, wherein each of the interconnection lines has a sine wave form and is disposed along a horizontal direction.

17. The semiconductor device of claim 14, further comprising an underfill layer disposed between the substrate and the semiconductor package.

18. The semiconductor device of claim 17,
wherein a bottom surface and a top surface of the underfill layer are attached to a top surface of the substrate and a bottom surface of the molding member, respectively; and
wherein the underfill layer is attached to sidewalls of the joint electrodes.

19. The semiconductor device of claim 17, wherein the underfill layer is comprised of an extendible material.

* * * * *